United States Patent
Skidmore et al.

(10) Patent No.: US 7,299,251 B2
(45) Date of Patent: Nov. 20, 2007

(54) ADAPTIVE FILTER

(75) Inventors: Ian David Skidmore, Malvern Worcestershire (GB); Ian Keith Proudler, Malvern Worcestershire (GB)

(73) Assignee: Qinetiq Limited (GB)

( * ) Notice: Subject to any disclaimer, the term of this patent is extended or adjusted under 35 U.S.C. 154(b) by 544 days.

(21) Appl. No.: 10/399,848

(22) PCT Filed: Oct. 25, 2001

(86) PCT No.: PCT/GB01/04717

§ 371 (c)(1),
(2), (4) Date: Apr. 21, 2003

(87) PCT Pub. No.: WO02/39584

PCT Pub. Date: May 16, 2002

(65) Prior Publication Data

US 2004/0071207 A1    Apr. 15, 2004

(30) Foreign Application Priority Data

Nov. 8, 2000  (GB) ................................ 0027238.5

(51) Int. Cl.
    *G06F 17/10*  (2006.01)
(52) U.S. Cl. .................................................. 708/322
(58) Field of Classification Search ................ 708/322, 708/323
    See application file for complete search history.

(56) References Cited

U.S. PATENT DOCUMENTS

| | | | | |
|---|---|---|---|---|
| 5,353,307 A | | 10/1994 | Lester et al. | |
| 5,436,928 A | * | 7/1995 | Fukuawa et al. | 375/232 |
| 5,517,239 A | * | 5/1996 | Nakayama | 348/222.1 |
| 5,677,951 A | * | 10/1997 | Gay | 379/406.08 |
| 6,445,792 B1 | * | 9/2002 | Shiraki et al. | 370/286 |

OTHER PUBLICATIONS

Moonen, et al., "Using a lattice algorithm to estimate the Kalman gain vector in fast Newton-type adaptive filtering" *Acoustics, Speech, and Signal Processing*, pp. 2265-2268 (1997).

Yuan, J., "QR-Decomposition-Based Least Squares Lattice Interpolators", *IEEE Transaction on Signal Processing*, vol. 48, pp. 70-79 (2000).

Moustakides, et al., "Fast Newton Transversal Filters-A New Class of Adaptive Estimation Algorithms," *IEEE Transactions on Signal Processing*, vol. 39, pp. 2184-2193 (1991).

* cited by examiner

*Primary Examiner*—Chuong D. Ngo
(74) *Attorney, Agent, or Firm*—McDonnell Boehnen Hulbert & Berghoff LLP

(57) ABSTRACT

An adaptive filter is implemented by a computer (10) processing an input signal using a recursive least squares lattice (RLSL) algorithm (12) to obtain forward and backward least squares prediction residuals. A prediction residual is the difference between a data element in a sequence of elements and a prediction of that element from other sequence elements. Forward and backward residuals are converted at (14) to interpolation residuals which are unnormalized Kalman gain vector coefficients. Interpolation residuals are normalized to produce the Kalman gain vector at (16). The Kalman gain vector is combined at (18) with input and reference signals x(t) and y(t), which provides updates for the filter coefficients or weights to reflect these signals as required to provide adaptive filtering.

29 Claims, 7 Drawing Sheets

ADAPTIVE FILTER

This invention relates to an adaptive filter and to a method and a computer program for implementing it.

Filtering is one of the most common procedures in signal processing. A filter processes a signal or signals at its input to produce an output signal having certain desirable characteristics. The exact form which these characteristics take is determined by the values taken by certain filter parameters. In a linear filter, the output is a weighted linear combination of the input signals and delayed versions thereof as generated by a tapped delay-line. The filter has controllable parameters which are weights used to weight this linear combination.

One known form of filter is a time-series filter (or transversal filter, which might be adaptive) with only one input signal. The filter forms a linear combination of delayed versions of the signal. The filter weights may be chosen to select or reject different frequency components of the input signal. Another form of filter is a phased array radar beamformer: in receive mode such a beamformer receives signals from an array of spatially separated sensors, the signals being generated in response to reception of radar waves reflected from a scene. The filter weights may be chosen, for example, to select or reject components of the sensor array signals depending on the radar wave direction of arrival at the sensors: such a beamformer is said to be a spatial filter because of its spatially selective properties. A sonar array beamformer is a related example of a spatial filter: here in receive mode signals from an array of sonar transducers and delayed versions of these signals constitute the input to the filter. By varying the filter weights, the sonar beamformer can select or reject signals based on both direction of arrival and frequency. Radar and sonar beamformers are also operative in a transmit mode in which filter techniques may be used to configure the transmitted beam.

A finite impulse response (FIR) filter, or transversal filter, is a known form of filter which may be implemented in hardware as a tapped delay line comprising a series-connected set of clock-activated registers each associated with a respective multiplier and multiplicative coefficient. Increasingly though FIR filters are implemented equivalently in software running on a computer system and accepting data from a sensor after conversion from analogue to digital electronic form. In a delay line version, a sequence of data elements $x(i)$, where i denotes a clock cycle index, is clocked along the line, each register holding one element at a time. The total number m of data elements is very much larger than the number N of registers, so only N successive elements occupy the line at any time. The line is occupied by data elements $x(1)$ to $x(N)$ on the Nth clock cycle. Clocking the line advances the sequence by one register, so that the leading element leaves one end of the line and a new element is introduced at the other. On the pth clock cycle the line is occupied by data elements $x(p-N+1)$ to $x(p)$. On each clock cycle the data element in each register is multiplied by the respective filter coefficient in the associated multiplier in each case ($w_i$ for the ith register, i=1 to N), and the resulting products are added to form a result which is $Z_N(p)$ for the pth cycle. I.e.:

$$z_N(p) = \sum_{i=1}^{N} w_i x(p - i + 1) \tag{1}$$

Equation (1) may alternatively be expressed as the scalar (dot) product of a weight vector w having elements $w_1$ to $w_N$ (the transversal filter coefficients or weights) and a data vector $x_N(p)$ having elements $x(p)$ to $x(p-N+1)$:

$$z_N(p) = w^T x_N(p) \tag{2}$$

where the superscript index T indicates a vector transpose.

It is a common requirement to obtain meaningful information from a set of data containing unwanted noise or other corrupting components in addition to a useful signal, and it is known to use linear filtering for this to improve signal to noise ratio. However, the choice of filter is difficult if not impossible if noise and signal characteristics are unknown: it then becomes desirable to use an adaptive filter with characteristics which are modifiable in response to data input to the system: in this regard filter adaptivity is important so that the filter properties will be determined from input data to be filtered, instead of a priori from making an estimate or assumption regarding the data characteristics. Filter adaptivity is realised by an adaptive filter with coefficients and therefore also properties which can be changed.

Adaptive filters have applications in fields such as radar and sonar as mentioned above, and also in communications and processing of images and speech. They can be used inter alia to perform channel equalisation, signal detection (i.e. matched filtering), acoustic echo cancellation and adaptive noise cancellation.

A typical example of an adaptive filter is that of an echo canceller in a 'hands-free' telephone system. Here a telephone microphone picks up not only speech from a person making the call, but also that of a recipient of the call whose speech is output by the telephone's loudspeaker. If no corrective action is taken the recipient's speech is also sent to the recipient and appears as an echo. If the recipient is using a hands-free telephone then the reply may be returned to the caller and positive feedback or 'howl around' may result.

The echo may be removed by an adaptive filter. The telephone's loudspeaker is driven by a speech signal $x(t)$ which becomes an input signal to the filter, and a reference signal $y(t)$ is picked up by the telephone's microphone. The filter coefficients are adjusted adaptively to cancel the echo signal in $y(t)$. Once the echo is removed, the residual signal, which contains only the caller's speech, is transmitted to the telephone call recipient. This residual signal may be termed an error signal $e_N(t)$, and it is used in adjusting the filter coefficients as will be described later.

There has been considerable work on the development of digital signal processing algorithms for adaptive filtering. There are two broad classes of algorithm: block-based algorithms and recursive algorithms. The former are used to process data in finite length blocks and the latter are used for processing a continuous data stream. The choice of algorithm depends on the intended field of use but for many problems recursive algorithms are more attractive.

For many years only two types of recursive adaptive filtering algorithms were known: Stochastic Gradient Descent (SGD) algorithms and Recursive Least Squares (RLS) algorithms. More recently recursive adaptive filtering algorithms of a new type have been introduced, and can be viewed as being hybrids of SGD and RLS algorithms.

An SGD algorithm (as typified by the well known Least Mean Squares (LMS) algorithm) requires very few mathematical operations per time instant and is robust to finite precision numerical effects, i.e. large fractional errors in small digital quantities; unfortunately the LMS algorithm is, in most cases, very slow to converge to an optimum solution.

RLS algorithms on the other hand are very quick to converge. However they require more mathematical operations per unit time, and this can make them completely impractical. For example, a filter for a hands-free telephone would require 4,000,000 floating-point arithmetic operations (flops) in one clock cycle of 100 μsec, equivalent to $4 \times 10^{10}$ flops/sec, which is not currently achievable using a single computer processor.

Furthermore RLS algorithms may exhibit mathematical instability; i.e. they may fail to operate properly due finite precision numerical effects, such as division by small inaccurate quantities: e.g. an eight-bit number may be inaccurate as regards the value of the least significant bit; if all bits of this number of other than the least significant bit are zero, i.e. the number is 00000001, then inaccuracy can lead to it becoming 00000000: the calculation may then involve division by zero.

A further consideration is that some RLS algorithms do not calculate the required filter coefficients explicitly but instead related quantities which are less useful for some applications.

A new class of hybrid algorithm was introduced in order to address the conflicting problems of convergence speed and computational burden. Examples are the Affine Projection algorithm and the Fast Newton algorithm. Here an LMS-type algorithm and an RLS algorithm work together to solve the adaptive filtering problem. The RLS algorithm is used to solve a problem that is much smaller than the original adaptive filter problem and hence does not present too much additional computational load. Together the LMS and RLS algorithms allow the adaptive filter to converge more quickly than the LMS on its own but usually not as fast as a proper RLS-based adaptive filter. These algorithms suffer from the fact that the RLS component to the algorithm can become numerically unstable.

At present there are three classes of RLS algorithms: quadratic RLS algorithms, fast transversal filter algorithms and RLS lattice algorithms. Quadratic RLS algorithms can be numerically stable but they have the disadvantage that, for a problem with N unknown coefficients to be determined, they require a number of mathematical operations per clock cycle that is proportional to $N^2$. For applications with large N (e.g. the acoustic echo cancellation problem where typically N=2000) this results in expensive hardware or is even impractical given current technology.

Fast transversal filter algorithms and RLS lattice algorithms on the other hand only require a number of mathematical operation per clock cycle that is proportional to N (termed 'fast' algorithms). Unfortunately, fast transversal filter algorithms are virtually unusable for large problems, due their numerical instability, i.e. sensitivity to finite precision numerical effects arising from inaccuracies and rounding errors in calculations. Moreover, although it is possible for RLS lattice algorithms to be numerically stable, they do not produce the most desirable parameters (the filter coefficients) directly.

In summary, RLS algorithms have optimal performance to the extent that they calculate the optimal set of filter coefficients (or related quantities) at all times. For a single channel problem of order N, i.e. having a number N of quantities to be determined, RLS algorithms fall into three categories:

$O(N^2)$ algorithms: computationally expensive—prohibitively so for large values of N;

$O(N)$ LS Lattice algorithms: computationally inexpensive (fast) but transversal filter weights are difficult to extract;

$O(N)$ Fast Transversal Filter algorithms: computationally inexpensive (fast) but numerically unstable;

here "O" indicates the order of magnitude (N or $N^2$) of the number of calculations to be performed per clock cycle as being that in the associated parentheses in each case.

Regardless of the field of application, most adaptive filtering applications demand the use of an algorithm with as high a performance but as low a complexity as possible. However, it is a prerequisite that the algorithm be numerically stable at least for all practical intents. Furthermore, many adaptive filtering applications require the actual filter weights themselves, not some other related parameters. In the prior art there is no RLS algorithm for an adaptive filter with these properties when the input to the filter consists of, in part or whole, delayed versions of one or more signals.

It is an object of this invention to provide an alternative form of adaptive filter.

The present invention provides an adaptive filter characterised in that it is arranged to update filter weights by means of a gain vector derived from interpolation residuals of a sequence of signal samples applied to the filter.

In this connection, a 'Kalman' gain vector is known in the prior art for the purposes of updating adaptive filter weights or coefficients, although not its derivation from interpolation residuals. An interpolation residual is one kind of prediction residual: a prediction residual is the difference between a directly obtained data element and a prediction of that element extrapolated from other data associated with it. An interpolation residual is obtained using data both preceding and following the data element. There are also forward and backward prediction residuals obtained using forward and backward extrapolation respectively from a directly obtained element.

The invention provides a number of advantages: it is an alternative form of adaptive filter; unlike prior art filters based on RLS lattice algorithms, the required filter weights are derived directly, not some other related parameters, and the invention can be implemented with an RLS algorithm or an algorithm with reduced computational load based on a simplifying assumption regarding the characteristics of the signal samples. There are also good theoretical reasons indicating that the invention is expected to provide results that are more numerically robust than alternative approaches.

In a preferred embodiment, the present invention also provides an adaptive filter characterised in that it is arranged to:

a) process an input sequence of signal samples to derive prediction residuals;
b) convert prediction residuals to interpolation residuals,
c) derive elements of a gain vector from the interpolation residuals; and
d) combine the gain vector with input and reference signals and update the filter coefficients or weights as required to provide adaptive filtering.

The gain vector may be a Kalman gain vector. The prediction residuals may be least squares prediction residuals, and these may be obtained by processing a sequence of signal samples using a recursive least squares lattice algorithm.

Prediction residuals may be converted to interpolation residuals corresponding to gain vector elements by an iterative approach in which each iteration changes an index (to be defined later) of a residual or of an intermediate quantity derived therefrom. The iterative approach may be a divide and conquer approach implemented by treating prediction residuals as interpolation residuals, iteration being arranged to proceed until the index is changed appropriately to convert the prediction residual to an interpolation residual providing an element of the gain vector in un-normalised form.

The iterative approach may be implemented by treating prediction residuals as interpolation residuals with zero values for one of two indices: this corresponds to an absence of succeeding or preceding time series signal samples. The iterations are arranged to proceed until the zero index in each case is changed sufficiently to convert the forward or backward residual to an interpolation residual which is also an element of the gain vector in un-normalised form. It may also involve treating as an intermediate result an iteration in a sequence thereof leading to an element of the un-normalised gain vector, iteration being arranged to proceed until an index of the intermediate result is changed sufficiently to convert such result to an interpolation residual corresponding to an element of the gain vector.

For an adaptive filter of order N where N is equal to $2^x$ and x is a positive integer, iteration in a sequence to generate an un-normalised element of the gain vector may begin with use of one of two residuals immediately adjacent and on opposite sides of a halfway point, the residual of use being that having a relatively higher value of the index not to be altered in the iteration sequence, and the relevant halfway point being halfway between two quantities:

a) one of which is an interpolation residual and the other a member of the relevant time series for which the gain vector is generated, or
   b) one of which is an interpolation residual and the other a starting point for an earlier iteration, or
   c) which are respectively starting and end points for an earlier iteration.

For an adaptive filter of order N where N is not a power of two, the iterative approach may still be used but will involve treating the filter weight vector as a combination of weight vectors of non-equal orders e.g. if N is equal to a sum of integers each of which is a power of two, the filter can be treated as a combination of filters each of order a respective power of two.

Iteration in a sequence to generate an un-normalised element of a gain vector may begin with use of one of two residuals immediately adjacent and on opposite sides of a halfway point, the residual of use being that having a relatively higher value of the index not to be altered in the iteration sequence, and the relevant halfway point being halfway between two quantities:

a) one of which is an interpolation residual and the other a member of the relevant time series for which the gain vector is generated, or
   b) one of which is an interpolation residual and the other a starting point for an earlier iteration, or
   c) which are respectively starting and end points for an earlier iteration.

The filter of the invention may arranged to convert prediction residuals to interpolation residuals corresponding to elements of a gain vector by a QR decomposition approach in which equations of the form:

a) $\zeta(i)=\psi(i)+k(i)\xi(i)$ are solved for $\zeta(i)$ and $k(i)$ given $\psi(i)$ and $\xi(i)$ subject to a constraint that in so doing there is minimisation of a sum of squares of $\psi(j)+k(i)\xi(j)$ obtained for different sample indexes j; and
   b) $\psi(i)=\zeta(i)-k(i)\xi(i)$ are solved for $\psi(i)$ and $k(i)$ given $\zeta(i)$ and $\xi(i)$ subject to a constraint that in so doing the value of $k(i)$ that is obtained is substantially that which would be obtained in solving $\zeta(i)=\psi(i)+k(i)\xi(i)$ for $\zeta(i)$ and $k(i)$.

QR decomposition may be arranged to employ square root free equivalents of sine and cosine rotation parameters.

In an alternative aspect, the present invention provides a method for adaptive filtering characterised in that it includes updating filter weights with a gain vector derived from interpolation residuals of a sequence of signal samples provided as data for filtering.

In a preferred embodiment, the method of the invention includes:

a) processing an input sequence of signal samples to derive prediction residuals;
   b) converting prediction residuals to interpolation residuals;
   c) deriving elements of a gain vector from the interpolation residuals; and
   d) combining the gain vector with input and reference signals and update the filter coefficients or weights as required to provide adaptive filtering.

The prediction residuals may be least squares prediction residuals obtained by processing a sequence of signal samples using a recursive least squares lattice algorithm.

Prediction residuals may be converted to interpolation residuals corresponding to gain vector elements by an iterative approach in which each iteration changes an index (to be defined later) of a residual or of an intermediate quantity derived therefrom. The iterative approach may be a divide and conquer approach which treats prediction residuals as interpolation residuals and changes the index appropriately to convert the prediction residual to an interpolation residual providing an element of the gain vector in un-normalised form. It may treat prediction residuals as interpolation residuals with zero values for one of two indices: this corresponds to absence of succeeding or preceding time series signal samples, and changes the zero index in each case sufficiently to convert the forward or backward residual to an interpolation residual which is also an element of the gain vector in un-normalised form The iterative approach may also treat as an intermediate result an iteration in a sequence thereof leading to an element of the gain vector and changes an index of the intermediate result sufficiently to convert such result to an interpolation residual corresponding to an element of the gain vector.

The filtering method may implement filtering of order N where N is equal to $2^x$ and x is a positive integer, characterised in that it includes iteration in a sequence to generate an un-normalised element of the gain vector, the iteration beginning with use of one of two residuals immediately adjacent and on opposite sides of a halfway point, the residual of use being that having a relatively higher value of an index not to be altered in the iteration sequence, and the relevant halfway point being halfway between two quantities:

a) one of which is an interpolation residual and the other a member of the relevant time series for which the gain vector is generated, or
   b) one of which is an interpolation residual and the other a starting point for an earlier iteration, or
   c) which are respectively starting and end points for an earlier iteration.

The filtering method may implement filtering of order N where N is not a power of two, characterised in that the iterative approach involves treating the filter as a combination of weight vectors each of order a respective power of two. It may include iteration in a sequence to generate an un-normalised element of the gain vector, the iteration beginning with use of one of two residuals immediately adjacent and on opposite sides of a halfway point, the residual of use being that having a relatively higher value of an index not to be altered in the iteration sequence, and the relevant halfway point being halfway between two quantities:
  a) one of which is an interpolation residual and the other a member of the relevant time series for which the gain vector is generated, or
  b) one of which is an interpolation residual and the other a starting point for an earlier iteration, or
  c) which are respectively starting and end points for an earlier iteration.

Prediction residuals may be converted to interpolation residuals corresponding to elements of a gain vector by a QR decomposition approach in which equations of the form:
  a) $\zeta(i)=\psi(i)+k(i)\xi(i)$ are solved for $\zeta(i)$ and $k(i)$ given $\psi(i)$ and $\xi(i)$ subject to a constraint that in so doing there is minimisation of a sum of squares of $\psi(j)+k(i)\xi(j)$ obtained for different sample indexes j; and
  b) $\psi(i)=\zeta(i)-k(i)\xi(i)$ are solved for $\psi(i)$ and $k(i)$ given $\zeta(i)$ and $\xi(i)$ subject to a constraint that in so doing the value of $k(i)$ that is obtained is substantially that which would be obtained in solving $\zeta(i)=\psi(i)+k(i)\xi(i)$ for $\zeta(i)$ and $k(i)$.

QR decomposition may employ square root free equivalents of sine and cosine rotation parameters.

In a further aspect, the present invention provides a computer program for implementing an adaptive filter characterised in that it is arranged to generate updated filter weights by means of a gain vector derived from interpolation residuals of a sequence of signal samples provided as data for filtering.

In a preferred embodiment, the present invention provides a computer program for implementing an adaptive filter characterised in that it is arranged to:
  a) process an input sequence of signal samples to derive prediction residuals;
  b) convert prediction residuals to interpolation residuals;
  c) derive elements of a gain vector from the interpolation residuals; and
  d) combine the gain vector with input and reference signals and update the filter coefficients or weights as required to provide adaptive filtering.

The computer program may be arranged to convert prediction residuals to interpolation residuals corresponding to gain vector elements by an iterative approach in which each iteration changes an index, to be defined later, of a residual or of an intermediate quantity derived therefrom. The iterative approach may be a divide and conquer approach implemented by treating prediction residuals as interpolation residuals, and wherein iteration is arranged to proceed until the index is changed appropriately to convert the prediction residual to an interpolation residual providing an element of the gain vector in un-normalised form. It may be implemented by treating the prediction residuals as interpolation residuals with zero values for one of two indices. This corresponds to absence of succeeding or preceding time series signal samples, and wherein iteration is arranged to proceed until the zero index in each case is changed sufficiently to convert the forward or backward residual to an interpolation residual which is also an element of the gain vector in un-normalised form.

The iterative approach may also involve treating as an intermediate result an iteration in a sequence thereof leading to an element of the gain vector, wherein iteration is also arranged to proceed until an index of the intermediate result is changed sufficiently to convert such result to an interpolation residual corresponding to an element of the gain vector.

The computer program may implement a adaptive filter of order N where N is equal to $2^x$ and x is a positive integer, characterised in that iteration in a sequence to generate an un-normalised element of the gain vector begins with use of one of two residuals immediately adjacent and on opposite sides of a halfway point, the residual of use being that having a relatively higher value of an index not to be altered in the iteration sequence, and the relevant halfway point being halfway between two quantities:
  a) one of which is an interpolation residual and the other a member of the relevant time series for which the gain vector is generated, or
  b) one of which is an interpolation residual and the other a starting point for an earlier iteration, or
  c) which are respectively starting and end points for an earlier iteration.

The computer program may implement a adaptive filter of order N where N is not a power of two, characterised in that the iterative approach involves treating the weight vector as a combination of weight vectors each of order a respective power of two.

Iteration in a sequence to generate an un-normalised element of the gain vector may begin with use of one of two residuals immediately adjacent and on opposite sides of a halfway point, the residual of use being that having a relatively higher value of an index not to be altered in the iteration sequence, and the relevant halfway point being halfway between two quantities:
  a) one of which is an interpolation residual and the other a member of the relevant time series for which the gain vector is generated, or
  b) one of which is an interpolation residual and the other a starting point for an earlier iteration, or
  c) which are respectively starting and end points for an earlier iteration.

The computer program may be arranged to convert prediction residuals to interpolation residuals corresponding to elements of a gain vector by a QR decomposition approach in which equations of the form:
  a) $\zeta(i)=\psi(i)+k(i)\xi(i)$ are solved for $\zeta(i)$ and $k(i)$ given $\psi(i)$ and $\xi(i)$ subject to a constraint that in so doing there is minimisation of a sum of squares of $\psi(j)+k(i)\xi(j)$ obtained for different sample indexes j; and
  b) $\psi(i)=\zeta(i)-k(i)\xi(i)$ are solved for $\psi(i)$ and $k(i)$ given $\zeta(i)$ and $\xi(i)$ subject to a constraint that in so doing the value of $k(i)$ that is obtained is substantially that which would be obtained in solving $\zeta(i)=\psi(i)+k(i)\xi(i)$ for $\zeta(i)$ ad $\zeta(i)$.

QR decomposition may be arranged to employ square root free equivalents of sine and cosine rotation parameters.

In order that the invention might be more fully understood, an embodiment thereof will now be described, by way of example only, with reference to the accompanying drawings, in which.

Figure 1:
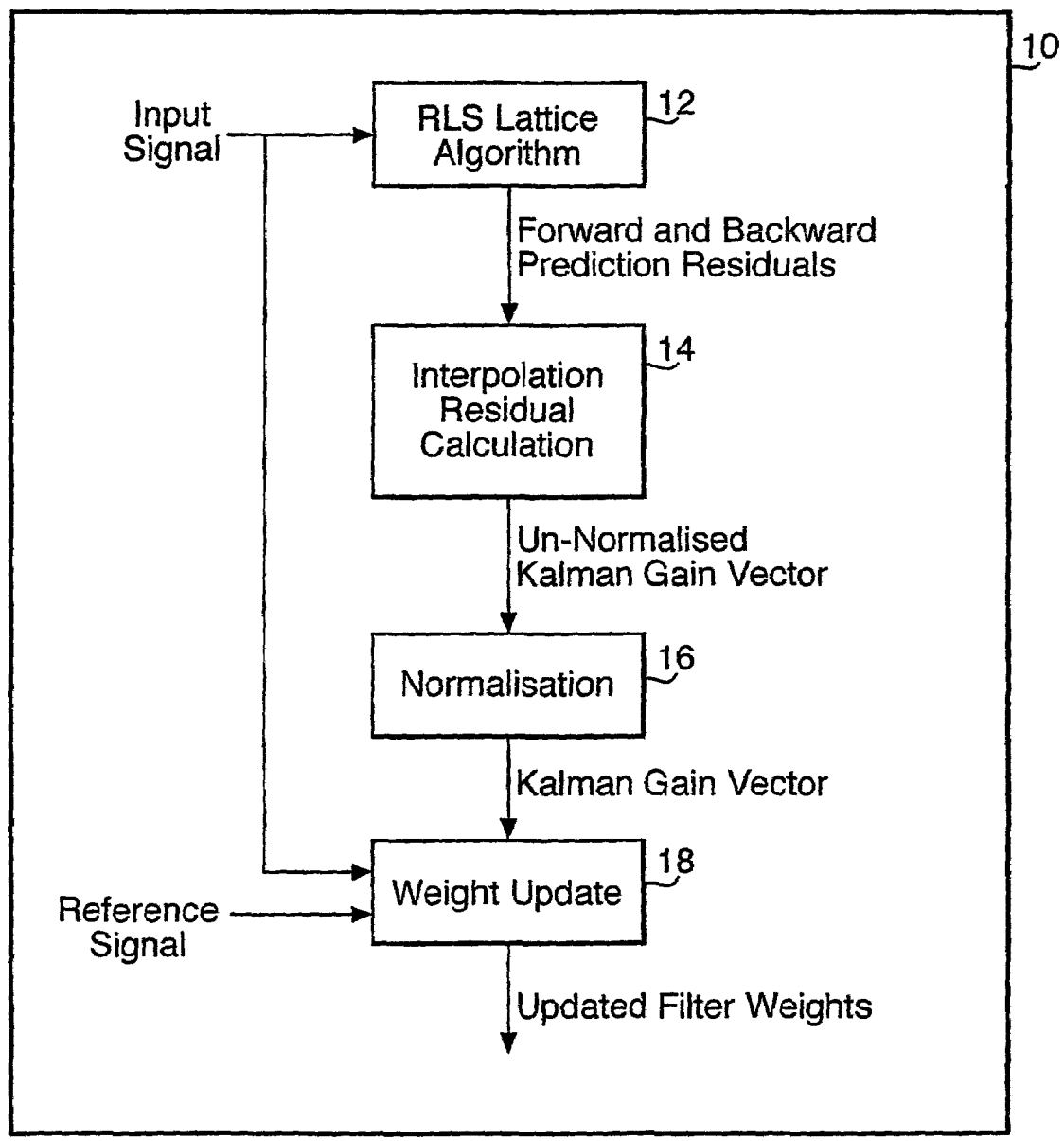
FIG. 1 is a block diagram of an adaptive filter of the invention.

In those prior art RLS algorithms which are not Lattice algorithms, what is referred to as the 'Kalman gain' vector $k^N(t)$ is used to update N adaptive filter coefficients on receipt of each of successive input signals forming a time series, i.e. a series of data values representing the variation of an input signal x(t) as a function of time t. Here t is in units of an interval between successive digital signal samples (clock cycles), and has integer values 1, 2 etc.

Designating the vector of adaptive filter coefficients at times t and t−1 as $w_N(t)$ and $w_N(t-1)$, where N is the number of filter coefficients (the order of the filter), then an operation to update filter coefficients adaptively in response to input of a new signal sample is defined by:

$$w_N(t) = w_N(t-1) + e_N(t) k^N(t) \quad (3)$$

where:

$$e_N(t) = y(t) - w_N^T(t-1) x_N(t) \quad (4)$$

and is known as the a priori error, $x_N(t)$ is a vector with elements consisting of input signal values from x(t) to x(t−N+1) as discussed above, superscript index T indicates a matrix transpose and y(t) is the most recent value of a reference signal detected for use in adaptive filtration as mentioned earlier in the example of a hands-free telephone system: $x_N(t)$ and y(t) are therefore known quantities. The Kalman gain vector $k^N(t)$ is conventionally defined as:

$$k^N(t) = M_{XX}^{-1}(t) x_N(t) \quad (5)$$

where $M_{xx}(t)$ is a covariance matrix of input signals given by:

$$M_{XX}(t) = \sum_{i=0}^{L_t-1} \beta_1^{2i} x_N(t-i) x_N^T(t-i), \quad (6)$$

$x_N(t-i)$ is a N-dimensional (column) vector with elements consisting of input signal values from x(t−i) to x(t−i−N+1) as discussed above, and $x_N^T(t-i)$ is its transpose (row vector). The parameter $L_1$ determines the number of samples that are included in the summation. Sometimes $L_1$ is chosen to be a fixed number and sometimes it is arranged to vary with time: e.g. $L_1=t+1$ is common. The Equation (6) summation could also start from a non-zero value of i if it were decided to discard the most recent data values. The term $\beta_1$ is what is referred to as a "forget factor": it has a value in the range $0<\beta_1 \leq 1$, normally $0.99<\beta_1<1.0$, and it decrements data elements so that the most recent data element x(t) is undecremented, that immediately preceding it is decremented once, the next twice and so on with the nth preceding it decremented n times. The effect of this is to bias the Equation (6) summation in favour of more recent data: i.e. it reduces the value of a data element each time the latter is used so that older data has progressively less influence on the solution compared to more recent data. Use of forget factors in signal processing is known, see e.g. U.S. Pat No. 4,727,503 to McWhirter.

Most RLS algorithms that use the Kalman gain vector calculate it using the above formulation or something related.

However, it has been discovered in accordance with the invention that the ith element $k_i^N(t)$ of the Nth order Kalman gain vector $k^N(t)$ for a signal at time t is also given by:

$$k_i^N(t) = \frac{\varepsilon_{N-i,i-1}(t-i+1)}{E_{N-i,i-1}(t-i+1)} \quad (7)$$

where $\epsilon_{N-i,i-1}(t-i+1)$ is what is referred to as an a posteriori least squares interpolation residual whose definition and derivation is described later. $E_{N-i,i-1}(t-i+1)$ is a normalisation factor (also described later) corresponding to the power of the interpolation residual $\epsilon_{N-i,i-1}(t-i+1)$. Equation (7) indicates that the time parameter (i.e. t−i+1) of the terms on its right hand side depends on the index i of the ith element $k_i^N(t)$, and therefore the time parameter varies from element to element of the Kalman gain vector $k^N(t)$.

Changing indices for convenience, for a signal element x(t−ƒ) in a sequence comprising a time series x(1) to x(t), a least squares interpolation residual is designated $\epsilon_{p,f}(t-f)$: the indices p and ƒ indicate that p signal elements before x(t−ƒ) and f signal elements after it in the time series are used in the interpolation: this interpolation residual is derived by subtracting from the element x(t−ƒ) itself an estimated interpolation or prediction of it derived from the signal elements both before (a total of p) and after (a total of f) it in the time series. An interpolation for the signal element x(t−ƒ) is given by a weighted linear combination or summation of p elements before it: x(t−ƒ−p) to x(t−ƒ−1) inclusive, together with a second such combination of the f elements after it: x(t−ƒ+1) to x(t). The least squares interpolation residual for the signal element x(t−ƒ) is then the difference between the element and the interpolation, $$\text{i.e. } \varepsilon_{p,f}(t-f) = x(t-f) - \sum_{i=1}^{f} \hat{w}_{p,f,i}(t-f) x(t-i+1) - \sum_{i=f+1}^{f+p} \hat{w}_{p,f,i}(t-f) x(t-i) \quad (8)$$

where the vector $\hat{w}_{p,f}(t-f)$ has (p+f) dimensions and contains adjustable coefficients $\hat{w}_{p,f,i}(t-f)$ (i=1 to f+p) and the summation terms are the weighted linear combinations. The reference to "least squares" indicates that these coefficients are those that would be produced by any least squares optimisation procedure. In a preferred embodiment of this invention, these coefficients are never calculated and the interpolation residuals are calculated via an alternative method as will be described later. Nevertheless, the least squares minimisation procedure involves determining coefficients in $\hat{w}_{p,f}(t-f)$ in such a way as to minimise a sum of a preselected number $L_2$ of the squares of the residuals determined up to and including the most recent residual, i.e. $\hat{w}_{p,f}(t-f)$ is the value of the vector ω that minimises:

$$J_{p,f}(t-f) = \sum_{n=0}^{L_2-1} \beta_2^{2n} \left( x(t-n-f) - \sum_{i=1}^{f} \omega_i x(t-n-i+1) - \sum_{i=f+1}^{f+p} \omega_i x(t-n-i) \right)^2 \quad (9)$$

As $L_1$ above, $L_2$ may be chosen to be invariant or may vary with time: $\beta_2$ is a "forget factor" like $\beta_1$ previously discussed.

Referring to Equation (7) once more, as has been said $E_{N-i,i-1}(t-i+1)$ is a normalisation factor which corresponds to the power of the interpolation residual signal $\epsilon_{N-i,i-1}(t-i+1)$: it can be calculated from the interpolation residuals themselves. There are many ways in which this can be done such as by forming a sum of a preselected number $L_3$ of the product of the a posteriori residuals and what are referred to as a priori residuals, which are defined below, and are determined up to including the most recent time instant, i.e.:

$$E_{N-i,i-1}(t-i+1) = \sum_{n=0}^{L_3-1} \beta_3^{2n} e_{N-i,i-1}(t-n-i+1) \varepsilon_{N-i,i-1}(t-n-i+1) \quad (10)$$

The term $e_{N-i,i-1}(t-i+1)$ is what is referred to as an a priori least squares interpolation and is calculated in a manner similar to the a posteriori residual (Equation (8)) except that the weight vector used is that calculated at the previous time instant i.e.

$$e_{p,f}(t-f) = x(t-f) - \sum_{i=1}^{f} \hat{w}_{p,f,i}(t-f-1)x(t-i+1) - \sum_{i=f+1}^{f+p} \hat{w}_{p,f,i}(t-f-1)x(t-i) \quad (11)$$

An a priori residual is related to an a posteriori equivalent by a so-called conversion factor $\delta_{p,f}(t-f)$ (calculation of which will be described later) as follows:

$$\epsilon_{p,f}(t-f) = \delta_{p,f}(t-f) e_{p,f}(t-f) \quad (12)$$

Equations (7) to (11) demonstrate the discovery in accordance with the invention that the gain vector (in the present example the Kalman gain vector) required to update filter coefficients can be generated from interpolation residuals. In this regard Equation (7) shows that each element of the Kalman gain vector is a ratio of a respective interpolation residual to the normalisation coefficient given by Equation (10), and Equations (8) and (9) yield the residuals themselves for derivation of the normalisation coefficient and Kalman gain vector.

In the present example all forget factors $\beta_1$ etc. are made equal: in this regard the value chosen depends on the nature of the signals being filtered. The associated number of summation terms is such that $L_1 = L_2 = L_4 = L_5 = t+1$, i.e. all available terms are included: NB $L_4$ and $L_5$ are defined in later equations.

In an adaptive filter in accordance with the invention therefore, a gain vector is determined from interpolation residuals such as for example that given by:

$$\epsilon_{p,f}(t-f) = x(t-f) - \hat{w}_{p,f}^T(t-f) \hat{x}_{p+f}(t,t-f) \quad (13)$$

where $x(t-f)$ is the $(t-f)$th data element of the time series, $\hat{w}_{p,f}^T(t-f) \hat{x}_{p+f}(t,t-f)$ represents an estimate of $x(t-f)$ obtained by interpolation from both earlier and later elements (subject to availability) of the time series, $\hat{w}_{p,f}^T(t-f)$ is an interpolation coefficient vector and as would be obtained in a least squares minimisation procedure. As mentioned earlier, the interpolation residuals may obtained without calculating $\hat{w}_{p,f}^T(t-f)$ as described later. The quantity $\hat{x}_{p+f}(t,t-f)$ is a vector consisting of p+f elements of the time series from $x(t-f-p)$ to $x(t)$ inclusive except for the omission of $x(t-f)$.

Referring to FIG. 1, stages for calculating an updated weight vector for an adaptive filter in response to a new input signal are shown in outline. These will be described briefly initially and more detail will be given later. A computer indicated by a box 10 is programmed to carry out four generalised processing stages 12 to 18. Of the latter, stage 12 comprises processing an input signal using an RLS lattice algorithm and obtaining forward and backward least squares prediction residuals. As indicated earlier, a prediction residual is the difference between a directly obtained data element and a prediction of that element extrapolated from other data associated with it; a forward prediction residual is obtained using forward extrapolation of data elements preceding a directly obtained element, and the backward equivalent is obtained by using backward extrapolation of data following that value. Forward and backward prediction residuals are naturally generated by an RLS lattice algorithm in a fast, numerically stable manner.

In stage 14, the forward and backward prediction residuals are used to generate interpolation residuals as appropriate to provide elements of an un-normalised Kalman gain vector with elements as indicated in the numerator of the right hand side of Equation (7). In the present example, a priori interpolation residuals are calculated together with conversion factors to convert them to a posteriori interpolation residuals using Equation (12). This approach is taken as it makes initialisation of various stored parameters easier than if a posteriori residuals are used.

In stage 16, to produce the normalised Kalman gain vector, each a posteriori interpolation residual is normalised by division by $E_{N-i,i-1}(t-i+1)$ the normalisation factor: this factor is calculated as the weighted sum of products, each product being that between a priori and a posteriori interpolation residuals for a respective time instant and the summation is over such products for all time instants for which signal samples have been obtained up to and including a most recent time instant as in Equation (10).

In stage 18, as indicated in Equations (3) and (4), the Kalman gain vector derived from input signal elements up to and including x(t) is combined with x(t) itself and a reference signal y(t); this produces an updated version of the filter coefficients or weights which have therefore been modified in response to both input and reference signal elements x(t) and y(t). To allow for processing delay in deriving the Kalman gain vector in stages 12 to 16, to achieve simultaneity at input to stage 18, the signal elements x(t) and y(t) are stored, or, if necessary in a real time system, delayed.

The RLS lattice algorithm is implemented in stage 12 as follows. A Least Squares (LS) lattice algorithm is an efficient algorithm for calculating least squares forward and backwards prediction residuals of a sequence of signals such as a time series: a time series is a series of data values representing the variation of a signal x(t) as a function of time.

An Nth order adaptive filter corresponds to a weight vector $w_N$ having N coefficients—the filter coefficients. Linear prediction residuals are produced as a first step in obtaining these coefficients and are of order 1 to N−1 inclusive. Residuals may be a posteriori or a priori, i.e. they may be produced using either a most recently determined weight vector or such a vector determined immediately previously. The nth order a posteriori LS forward prediction residual $\epsilon_n^F(t)$ for a time series of signals with a value x(t) at time t is defined as:

$$\epsilon_n^F(t) = x(t) - a_n^T(t) x_n(t-1) \tag{14}$$

where $x_n(t-1)$ is a data vector having elements x(t−1) to x(t−n) inclusive, and $a_n(t)$ is the forward prediction coefficient vector which is again determined in a least squares optimisation procedure described later: this vector is determined in such a way as to minimise a weighted sum $J_n^F(t)$ of a preselected number ($L_4$) of squares of residuals determined up to and including a most recent residual, i.e. $a_n(t)$ is the value of the vector $\omega$ that minimises:

$$J_n^F(t) = \sum_{m=0}^{L_4-1} \beta_4^{2m} (x(t-m) - \underline{\omega}^T \underline{x}_n(t-m-1))^2 \tag{15}$$

where $\beta_4$ is a forget factor as described earlier.

Similarly, the nth order a posteriori LS backward prediction residual $\epsilon_n^B(t)$ for a time series of signals with a value x(t) at time t is defined as:

$$\epsilon_n^B(t) = x(t-n) - c_n^T(t) x_n(t) \tag{16}$$

where $c_n(t)$ is a coefficient vector for backward prediction determined as before by a least squares optimisation procedure which minimises a weighted sum of a number $L_5$ of squares of residuals determined up to and including the most recent residual, i.e. $c_n(t)$ is the value of the vector $\omega$ that minimises:

$$J_n^B(t) = \sum_{m=0}^{L_5-1} \beta_5^{2m} (x(t-m-n) - \underline{\omega}^T \underline{x}_n(t-m))^2 \tag{17}$$

where $\beta_5$ is a forget factor.

The corresponding a priori forward and backward LS prediction residuals $e_n^F(t)$ and $e_n^B(t)$ respectively are defined similarly as follows:

$$e_n^F(t) = x(t) - a_n^T(t-1) x_n(t-1) \tag{18}$$

$$e_n^B(t) = x(t-n) - c_n^T(t-1) x_n(t) \tag{19}$$

Conversion factors $\delta_n^F(t)$ and $\delta_n^B(t)$ which relate forward and backward a priori residuals to respective a posteriori equivalents are defined as:

$$\delta_n^F(t) = \frac{\epsilon_n^F(t)}{e_n^F(t)} \tag{20}$$

$$\delta_n^B(t) = \frac{\epsilon_n^B(t)}{e_n^B(t)} \tag{21}$$

An Nth order Least Squares Lattice (LSL) algorithm generates a set of forward and backward a posteriori prediction residuals, N of each, i.e. $\{\epsilon_1^f(t), \ldots \epsilon_N^f(t), \epsilon_1^b(t), \ldots \epsilon_N^b(t)\}$. Here N is used in a general sense, and is not necessarily the same value as N used elsewhere herein. The particular LSL algorithm used in the present example is a Square Root Free QR Decomposition-based Recursive Least Squares Lattice (RLSL) Algorithm. Internally it calculates not the a posteriori prediction residuals directly but instead it calculates the a priori prediction residuals and the corresponding conversion factors. The algorithm is related to recursive square root free QR decomposition as described in U.S. Pat. No. 4,727,503 to McWhirter, which describes boundary and internal cell functions for a systolic array carrying out this function using inter alia a square root free equivalent of Givens rotations. See also I K Proudler, J G McWhirter and T J Shepherd, "Computationally Efficient, QR Decomposition Approach to Least Squares Adaptive Filtering", IEE Proceedings, vol.138, Pt. F, no.4, August 1991, pp.341-353.

QR decomposition is a well-known procedure which is used in solving sets of linear equations by determining a matrix Q of rotation parameters which will transform a data matrix X into an upper right triangular matrix R (i.e. with all sub-diagonal elements zero) by rotation of its co-ordinate system: such an R matrix has a last row corresponding to one equation with a single unknown and allowing the equations to be solved by back substitution. Rotation parameters are sines and cosines or square root free equivalents of these.

Figure 2:
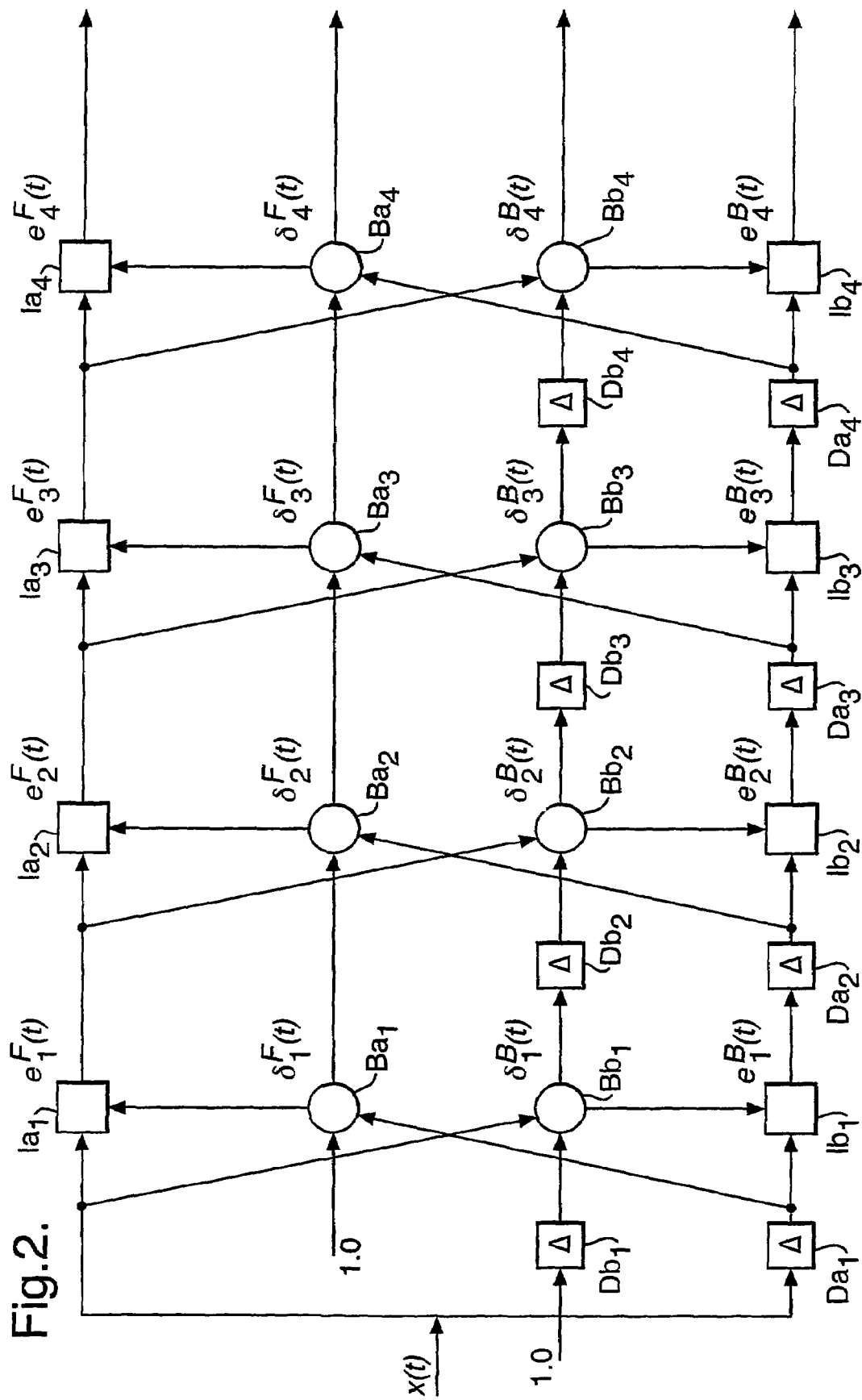
FIG. 2 shows four successive stages of a recursive least squares lattice algorithm indicated in FIG. 1.

FIG. 2 is a diagram illustrating the first four successive steps of the RLSL algorithm, which are concatenated stages: the ith stage (i=1, 2, 3, or 4) includes two internal cells (squares) $Ia_i$ and $Ib_i$, two boundary cells $Ba_i$ and $Bb_i$ and two delay cells $Da_i$ and $Db_i$. The expressions "internal cell" and "boundary cell" are conventional in QR processing and originally distinguished above-diagonal cells from on-diagonal cells in a triangular array: they are now used to distinguish cells which apply rotation parameters from those that evaluate them.

As described in U.S. Pat. No. 4,727,503, boundary cells evaluate rotation parameters from input data and cumulatively multiply cosine-like rotation parameters; internal cells apply rotation parameters to input data. Each of these cells also recomputes and stores a quantity in response to each input, and their processing functions will be described later in more detail. Each delay cell $Da_i$ and $Db_i$ store an input signal for a single time interval and outputs an immediately preceding input signal: e.g. when $Da_1$ receives a new input signal such as data element x(t) it outputs the preceding input signal x(t−1) and stores the new one until the next input signal x(t+1) is received. The ith stage provides both forward and backward prediction residuals of order i using input signals x(t) when i=1 and when i is 2 or more using residuals corresponding to outputs from stage i−1.

At time instant t, a data element x(t) is input to the first stage of the RLSL algorithm: it passes to the first internal cell $Ia_1$, first delay cell $Da_1$ and second boundary cell $Bb_1$. The first delay cell $Da_1$ outputs x(t−1) to the second internal cell $Ib_1$ and first boundary cell $Ba_1$. The first boundary cell $Ba_1$ and second boundary cell $Bb_1$ also receive inputs of 1, the latter from the second delay cell $Db_1$ (unnecessary but included for conformity between stages). The sequence of operations then flows from left to right.

The cells of the first RLSL algorithm stage generate quantities and pass them as follows:

first boundary cell $Ba_1$: uses x(t−1) to update a quantity stored within it, and it calculates square root free rotation parameters from the stored quantity and passes them to the first internal cell $Ia_1$; it calculates the conversion factor $\delta_1^F(t)$ (as defined in Equation (20) with n=1 relating a priori and a posteriori forward prediction residuals) and passes it as an input to the second stage first boundary cell $Ba_2$;

second boundary cell $Bb_1$: uses x(t) to update a stored quantity, and it calculates square root free rotation parameters from the stored quantity and passes them to second internal cell $Ib_1$; it calculates the conversion factor $\delta_1^B(t)$ relating a priori and a posteriori backward prediction residuals and passes it an input to the second stage second delay cell $Db_2$, which responds by outputting $\delta_1^B(t-1)$ (received previously) to the second stage second boundary cell $Bb_2$;

first internal cell $Ia_1$: uses x(t) to update a stored quantity; it then calculates the a priori forward prediction residual $e_1^F(t)$ (i.e. n=1 in Equation (18)) and passes it to the second stage first internal and second boundary cells $Ia_2$ and $Bb_2$;

second internal cell $Ib_1$: uses x(t−1) to update a stored quantity; it then calculates the a priori backward prediction residual $e_1^B(t)$ (i.e. n=1 in Equation (19)) passes it to the second stage first delay cell $Da_2$, which responds by outputting $e_1^B(t-1)$ (received previously) to the second stage second internal cell $Ib_2$ and first boundary cell $Ba_2$;

The values $e_1^F(t)$, $\delta_1^F(t)$, $e_1^B(t)$ and $\delta_1^B(t)$ are evaluated and passed on in this way by the first stage solving the first order (n=1) forward and backward linear prediction problems: the second stage solves the second order (n=2) equivalent of this, i.e. the second stage internal and boundary cells $Ia_2$, $Ba_2$, $Ib_2$ and $Bb_2$ calculate results equivalent to those of the first stage but with the subscript index 2, i.e. $e_2^F(t)$, $\delta_2^F(t)$, $e_2^B(t)$ and $\delta_2^B(t)$. Similarly, the third and fourth stages subsequently calculate third and fourth order equivalents with index n=3 and n=4. Nth order prediction residuals require N stages four of which are shown in FIG. 2.

As has been said, the terms $e_n^F(t)$ and $e_n^B(t)$ generated as described above are a priori prediction residuals: they can be converted to a posteriori residuals $\epsilon_n^F(t)$ and $\epsilon_n^B(t)$ using terms $\delta_n^F(t)$ and $\delta_n^B(t)$ also generated by the RLSL algorithm and substituting into Equations (20) and (21) above as follows:

$$\epsilon_n^F(t) = \delta_n^F(t) e_n^F(t) \quad (22)$$

$$\epsilon_n^F(t) = \delta_n^B(t) e_n^B(t). \quad (23)$$

Once the a posteriori prediction residuals have been calculated using Equations (22) and (23), they may be used as hereinafter described to calculate interpolation residuals that make up the un-normalised Kalman gain vector, which is the numerator of the right hand side of Equation (7). However it is advantageous for initialisation purposes as noted above to calculate the interpolation residuals in a priori form together with corresponding conversion factors. Hence in the present example Equations (22) and (23) are not implemented.

Figure 3:
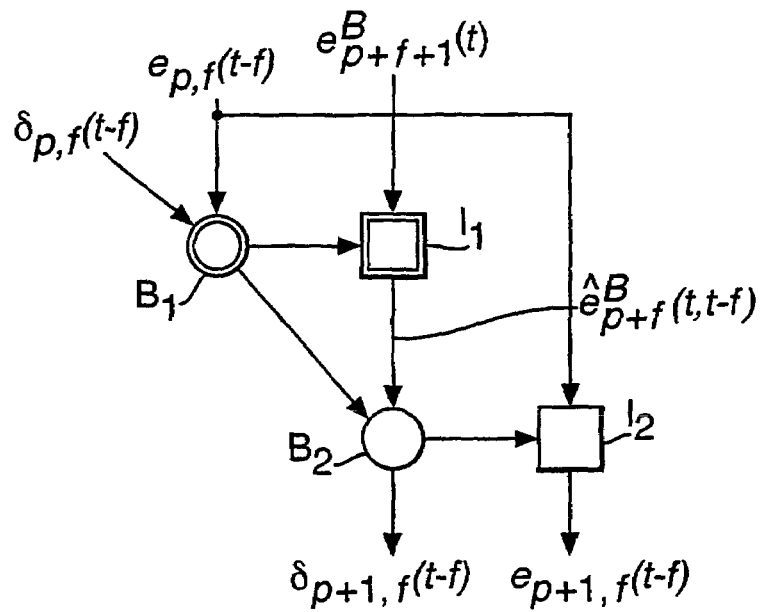
FIGS. 3 and 4 illustrate conversion of a first interpolation residual into a second such residual with a relative change of unity in an index.
Figure 4:
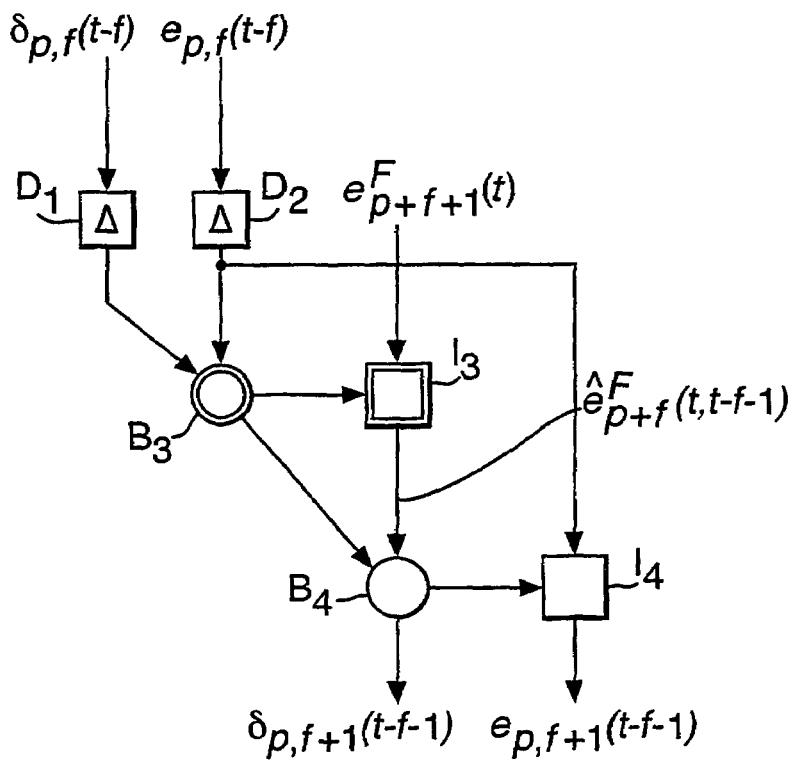

FIGS. 3 and 4 show how an a priori interpolation residual such as $e_{p,f}(t-f)$ (and the corresponding conversion factor) can be used, together with certain prediction residuals, to generate two other interpolation residuals: relative to the indices and time instant of the original interpolation residual, one of the two residuals generated from it has a p index increased by 1 and the other has an f index increased likewise and a time instant one sample interval earlier, i.e. $e_{p+1,f}(t-f)$ and $e_{p,f+1}(t-f-1)$.

In FIG. 3, the a priori interpolation residual $e_{p,f}(t-f)$ and its associated conversion factor $\delta_{p,f}(t-f)$ are converted into the a priori interpolation residual $e_{p+1,f}(t-f)$ and its associated conversion factor $\delta_{p+1,f}(t-f)$. The process involves two internal cells (squares) $I_1$ and $I_2$ and two boundary cells $B_1$ and $B_2$. Boundary cells evaluate rotation parameters and, in the case of $B_2$, cumulatively multiply cosine-like rotation parameters; internal cells apply rotation parameters to data. Each of these cells also recomputes and stores a quantity in response to each input, and their processing functions will be described next in more detail.

Boundary cell $B_1$: uses the a priori interpolation residual $e_{p,f}(t-f)$ and conversion factor $\delta_{p,f}(t-f)$ to update a quantity stored within it, and it calculates square root free rotation parameters from the stored quantity and passes them to first internal cell $I_1$; it passes the conversion factor $\delta_{p,f}(t-f)$, relating a priori and a posteriori residuals, at its input to the boundary cell $B_2$;

internal cell $I_1$: uses the a priori backward prediction residual $e_{p+f+1}^B(t)$ and rotation parameters from boundary cell $B_1$ to update a stored quantity; it then calculates the quantity $\hat{e}_{p+f}^B(t,t-f)$ and passes it to the boundary cell $B_2$;

boundary cell $B_2$: uses $\hat{e}_{p+f}^B(t,t-f)$ $e_{p,f}(t-f)$ and conversion factor $\delta_{p,f}(t-f)$ to update a stored quantity, and it calculates square root free rotation parameters from the stored quantity and passes them to internal cell $I_2$; it calculates the conversion factor $\delta_{p+1,f}(t-f)$ relating a priori and a posteriori residuals;

internal cell $I_2$: uses $e_{p,f}(t-f)$ $e_{p+f+1}^B(t)$ and rotation parameters from boundary cell $B_2$ to update a stored quantity; it then calculates the a priori interpolation residual $e_{p+1,f}(t-f)$;

In FIG. 4, the a priori interpolation residual $e_{p,f}(t-f)$ and its associated conversion factor $\delta_{p,f}(t-f)$ are converted into the a priori interpolation residual $e_{p,f+1}(t-f-1)$ and its associated conversion factor $\delta_{p,f+1}(t-f-1)$. With the exception of the two delay cells ($D_1$ and $D_2$), the underlying operations are exactly the same as described in relation to FIG. 3 it is the use of different input signals that distinguishes the approaches described with reference to FIGS. 3 and 4.

In FIG. 4, the process involves two delay cells $D_1$ and $D_2$, two internal cells (squares) $I_3$ and $I_4$ and two boundary cells $B_3$ and $B_4$. Each of the delay cells $D_1$ and $D_2$ stores an input signal for a single time interval: when it receives a new input signal h(t) it outputs the preceding input signal h(t−1) and stores the new one until the next input signal h(t+1) is received. Boundary cells $B_3$ and $B_4$ evaluate rotation parameters and, in the case of $B_4$, cumulatively multiply cosine-like rotation parameters; internal cells apply rotation parameters to data. Each of these cells also recomputes and stores a quantity in response to each input, and their processing functions will be described later in more detail.

Boundary cell $B_3$: uses the a priori interpolation residual $e_{p,f}(t-f-1)$, output from delay cell $D_2$, and conversion factor $\delta_{p,f}(t-f-1)$ to update a quantity stored within it, and it calculates square root free rotation parameters from the stored quantity and passes them to first internal cell $I_1$; it passes the conversion factor $\delta_{p,f}(t-f-1)$, output from delay cell $D_1$, relating a priori and a posteriori residuals, at its input to the boundary cell $B_4$;

internal cell $I_3$: uses the a priori forward prediction residual $$e^F_{p+f+1}(t)$$

and rotation parameters from boundary cell $B_3$ to update a stored quantity; it then calculates the quantity $$\hat{\varepsilon}^F_{p+f}(t, t-f-1)$$

and passes it to the boundary cell $B_4$;

boundary cell $B_4$: uses $$\hat{\varepsilon}^F_{p+f}(t, t-f-1)$$

and conversion factor $\delta_{p,f}(t-f-1)$ to update a stored quantity, and it calculates square root free rotation parameters from the stored quantity and passes them to internal cell $I_2$; it calculates the conversion factor $\delta_{p,f+1}(t-f-1)$ relating a priori and a posteriori residuals;

internal cell $I_4$: uses $e_{p,f}(t-f-1)$ and rotation parameters from boundary cell $B_4$ to update a stored quantity; it then calculates the a priori interpolation residual $e_{p,f+1}(t-f-1)$;

The details of the function of the cells in FIGS. 3 and 4 will now be described. In IEEE Trans SP January 2000 vol 48(1) pp.70-79, "QR decomposition based least squares lattice interpolators", J T Yuan shows that it is possible to use an a posteriori interpolation residual $\epsilon_{p,f}(t-f)$, or a one step delayed equivalent $\epsilon_{p,f}(t-f-1)$, to generate a posteriori interpolation residuals $\epsilon_{p+1,f}(t-f)$ and $\epsilon_{p,f+1}(t-f-1)$ as set out in Equations (24) and (25) below:

$$\varepsilon_{p+1,f}(t-f) = \varepsilon_{p,f}(t-f) + k_{p+1,f}(t)\hat{\varepsilon}^B_{p+f}(t, t-f) \quad (24)$$

$$\varepsilon_{p,f+1}(t-f-1) = \varepsilon_{p,f}(t-f-1) + \mu_{p,f+1}(t)\hat{\varepsilon}^F_{p+f}(t, t-f-1) \quad (25)$$

where $k_{p+1,f}(t)$ and $\mu_{p,f+1}(t)$ are coefficients determined by a least squares minimisation procedure, i.e. $k_{p+1,f}(t)$ and $\mu_{p,f+1}(t)$ are set equal to the value of the coefficients $\omega_1$ and $\omega_2$ (respectively) that minimise the weighted sum of the squares of values of the terms $$\varepsilon_{p,f}(t-f) + \omega_1 \hat{\varepsilon}^B_{p+f}(t, t-f)$$

and $$\varepsilon_{p,f}(t-f-1) + \omega_2 \hat{\varepsilon}^F_{p+f}(t, t-f-1)$$

(respectively) over a succession of evaluations at different times t. The quantities $$\hat{\varepsilon}^B_{p+f}(t, t-f)$$

and $$\hat{\varepsilon}^F_{p+f}(t, t-f-1)$$

are calculated from other known quantities as will be described later. Here the circumflex symbol above $\epsilon$ in each case indicates that the quantities $$\hat{\varepsilon}^B_{p+f}(t, t-f)$$

and $$\hat{\varepsilon}^F_{p+f}(t, t-f-1)$$

are, respectively, not the same as the backward and forward linear prediction residuals given by Equations (16) and (14);

$$\hat{\varepsilon}^B_{p+f}(t, t-f)$$

is a backward prediction residual of order $(p+f)$ at time $(t)$ derived with the omission of data element $x(t-f)$, and $$\hat{\varepsilon}^F_{p+f}(t, t-f-1)$$

is a forward prediction residual of order (p+f) at time (t) derived with the omission of data element x(t−f−1).

In the above analysis the time index (t−f) has been used for convenience, although strictly speaking it can be shown mathematically that the parameter f is superfluous.

There are several well known methods for solving least squares minimisation problems. In this example such a method based on QR Decomposition (QRD) is employed: it will be described in terms of determining a coefficient k(t) in a generalised equation as follows. Each of Equations (24) and (25) is of the form:

$$\zeta(t) = \psi(t) + k(t)\xi(t) \tag{26}$$

Equation (26) it is required to calculate, at time instant t, the coefficient k(t) given input data $\xi(t)$ and $\psi(t)$ (a posteriori modified prediction and interpolation residuals respectively), and subject to the constraint that in so doing there is minimisation of a sum of squares of the quantity $\psi(i) + \omega\xi(i)$ calculated for certain different times i and weighted by forget factors $\beta$: i.e. k(t) is equal to the value of a parameter $\omega$ that delivers a minimum value for the expression:

$$\sum_{i=0}^{L} \beta^{2i}(\psi(t-i) + \omega\xi(t-i))^2 \tag{27}$$

The parameter L determines the number of past samples that are included in the summation. As mentioned earlier L may be fixed or may vary with time, and $\beta$ is a forget factor. The effect of calculating k(t) in this way is to attenuate any component of $\xi(t)$ which also appears in $\psi(t)$. The term $\zeta(t)$ is an posteriori least squares residual for the problem.

In this example the preferred method for solving the least squares problem given in Equations (26) and (27) involves not the a posteriori residuals $\xi(t)$ and $\psi(t)$ but corresponding a priori residuals, u(t) and v(t), respectively, to which a conversion factor $\delta_m(t)$ is applied: it might be anticipated that there is a different conversion factor for each residual, but in fact in the present example it has been found that they are the same. In addition the preferred method does not solve the least squares problem given in Equations (26) and (27) directly but instead uses a recursive procedure that calculates k(t) based on the a priori residuals u(t) and v(t) and the conversion factor $\delta_m(t)$ at only the current time instant and knowledge of the values of various parameters calculated at the previous time instant and stored for later use. One such stored parameter is the value of the least squares coefficient at the previous time instant i.e. k(t−1).

By an analysis related to that of S Hammarling, "A Note on Modifications to the Givens Plane Rotation", J. Inst. Maths. Applics., vol. 13, pp. 215-218, 1974, and described in U.S. Pat. No. 4,727,503 to McWhirter, it can be shown that k(t) can be calculated from the following recursions—which also yield the a priori residual associated with $\zeta(t)$ (i.e. z(t)) and the corresponding conversion factor ($\delta_{out}(t)$):

$$d(t) = \beta^2 d(t-1) + \delta_{in}(t)|u(t)|^2 \tag{28}$$

$$s = \frac{\delta_{in}(t)u(t)}{d(t)} \tag{29}$$

$$\delta_{out}(t) = \frac{\beta^2 d(t-1)\delta_{in}(t)}{d(t)} \tag{30}$$

$$z(t) = v(t) + k(t-1)u(t) \tag{31}$$

$$k(t) = k(t-1) - sz(t) \tag{32}$$

The term d(t) is defined by Equation (28) and represents an estimate of the energy of the time series u(0) to u(t) inclusive but with more weight given to more recent samples. All terms on the right-hand side of Equation (28) are known at time t: the term d(t−1) was obtained in the immediately preceding time instant by calculation if t=2 or more; for t=1 the corresponding initial term d(0) is given a predefined value such as zero; the terms $\delta_{in}(t)$ and u(t) are input data. The term s is a generalised rotation parameter of the kind used in QR decomposition: it is defined by Equation (29) in terms of input data $\delta_{in}(t)$ and u(t) together with a quantity d(t) calculated for the relevant time instant using Equation (28). Equation (30) defines the conversion factor $\delta_{out}(t)$ for the residual z(t) in terms of known quantities: i.e. d(t−1) is known from the previous time instant and $\delta_{in}(t)$ and d(t) have been calculated for this time instant using Equation (28). Together Equations (28) to (30) inclusive represent the calculation that takes place for each time instant in the boundary cells $Ba_1$ etc. shown in FIG. 2 and the boundary cells $B_2$ and $B_4$ shown in FIGS. 3 and 4.

Equations (31) and (32) represent the calculation that takes place for each time instant in the internal cells $Ia_1$ etc. in FIG. 2 and the internal cells $I_2$ and $I_4$ shown in FIGS. 3 and 4. Equation (31) expresses z(t) in terms of two known quantities (input data) u(t) and v(t), and a value k(t−1) evaluated earlier for data of time instant (t−1) where t=2 or more; t=1 corresponds to the term k(0) which is set equal to a predefined value such as zero. Equation (32) expresses k(t) in terms of quantities s and z(t) calculated from Equations (29) and (31) together with k(t−1) from the previous time instant. With the knowledge of any starting value eg k(0) it is therefore possible to generate a succession of subsequent values of z(t) and k(t) using Equations (28) to (32):

Referring to Equations (24) and (25) once more, the quantities $$\hat{\varepsilon}^B_{p+f}(t, t-f)$$

and $$\hat{\varepsilon}^F_{p+f}(t, t-f-1)$$

are required in the foregoing calculations, and they are in fact obtained from other known quantities according to:

$$\hat{\varepsilon}^B_{p+f}(t, t-f) = \varepsilon^B_{p+f+1}(t) - \eta_{p+1,f}(t)\varepsilon_{pf}(t-f) \tag{33}$$

$$\hat{\varepsilon}^F_{p+f}(t, t-f-1) = \varepsilon^F_{p+f+1}(t) - v_{p,f+1}(t)\varepsilon_{p,f}(t-f-1) \tag{34}$$

where $\eta_{p+1,f}(t)$ and $v_{p,f+1}(t)$ are coefficients determined by a modified least squares minimisation procedure which will now be described: this procedure involves recursive least squares minimisation, and the two least squares problems in Equations (33) and (34) have the same form, i.e.:

$$\psi(t) = \zeta(t) - k(t)\xi(t) \tag{35}$$

where $\zeta(t)$ and $\xi(t)$ are known input data (a posteriori prediction and interpolation residuals respectively), and k(t) and $\psi(t)$ are to be calculated. Although it is a modified procedure as compared to that associated with Expressions (26) and (27), it can be shown that this recursive least squares procedure calculates the same value for the coefficient k(t) that would have been obtained by solving the conventional least squares problem described by Expressions (26) and (27) and implemented by recursion Equations (28) to (32): the latter had $\psi(t)$ and $\xi(t)$ as input data and yielded k(t) and $\zeta(t)$, but in the present case $\psi(t)$ is not available. However it can be shown that k(t) can be derived without knowledge of $\psi(t)$ provided k(t−1) and $\zeta(t)$ are known. This is explained below but in terms of the corresponding a priori residuals and associated conversion factors: a priori residuals (Roman symbols) z(t), u(t) and v(t) correspond respectively to a posteriori residuals (Greek symbols) $\zeta(t)$, $\xi(t)$ and $\psi(t)$.

Equations (28) to (32) show that k(t) can be derived from k(t−1) with knowledge of v(t). Furthermore the recursion produces z(t) as a by-product. For the purpose of implementing the aforementioned modified recursive least squares procedure, it can be shown that these equations can be reordered in a way such that it is possible to derive a value for k(t) from k(t−1) without knowledge of v(t) provided z(t) is known which is the case. Moreover, these equations, so reordered, produce v(t) as a by-product and are set out in Equations (36) to (40) below:

$$d(t) = \beta^2 d(t-1) + \delta_{in}(t)|u(t)|^2 \quad (36)$$

$$s = \frac{\delta_{in}(t)u(t)}{d(t)} \quad (37)$$

$$\delta_{out}(t) = \delta_{in}(t) \quad (38)$$

$$v(t) = z(t) - k(t-1)u(t) \quad (39)$$

$$k(t) = k(t-1) - s\, z(t) \quad (40)$$

It is reiterated that Equations (36) to (40) are in terms of a priori residuals (Roman symbols) z(t), u(t) and v(t), which correspond respectively to a posteriori residuals (Greek symbols) $\zeta(t)$, $\xi(t)$ and $\psi(t)$.

The term d(t) is defined by Equation (36) and represents an estimate of the energy of the time series u(0) to u(t) inclusive but with more weight given to more recent samples. All terms on the right-hand side of Equation (36) are known at time t: for t=2 or more, the term d(t−1) is known from the previous time instant; in the case of t=1 and d(0), d(0) is set equal to a predefined value such as zero; the terms $\delta_{in}(t)$ and u(t) are input data. The term s is a generalised rotation parameter: it is defined by Equation (37) in terms of input data $\delta_{in}(t)$ and u(t) and d(t) calculated using Equation (36). Equation (38) defines the conversion factor $\delta_{out}(t)$ for the residual v(t) as being equal to the known input conversion factor $\delta_{in}(t)$. Together Equations (36) to (38) inclusive represent the calculation carried out in the boundary cells $B_1$ and $B_3$ and described with reference to FIGS. 3 and 4.

Equations (39) and (40) express the calculation carried out in the internal cells $I_1$ and $I_3$ shown in FIGS. 3 and 4. Equation (39) expresses v(t) in terms of known quantities, i.e. input data u(t) and z(t) together with a value k(t−1) evaluated earlier for data of time (t−1), or, in the case of k(0), set to a predefined values such as zero. Equation (40) expresses k(t) in terms of the quantities s calculated using Equation (37) and the input datum z(t) together with k(t−1) from the previous time instant. With the knowledge of any starting value eg k(0) it is therefore possible to generate a succession of subsequent values of v(t) and k(t) for subsequent time instants using Equations (36) to (40).

Equations (24) et sequi show that an a posteriori interpolation residual such as $\epsilon_{p,f}(t-f)$ (or equivalently an a priori interpolation residual $e_{p,f}(t-f)$ and the corresponding conversion factor $\delta_{p,f}(t-f)$) or a one sample time interval delayed equivalent $e_{p,f}(t-f-1)$ can be used, together with certain prediction residuals, to generate two other interpolation residuals: relative to the indices of the original interpolation residual, one of the two residuals generated from it has a p index increased by 1 and the other has an f index increased likewise, i.e. $\epsilon_{p+1,f}(t-f)$ and $\epsilon_{p,f+1}(t-f-1)$. This is shown in FIGS. 3 and 4 in terms of a priori interpolation residuals and the corresponding conversion factors.

For convenience the vector $\hat{k}^N(t)$ is defined to be the un-normalized Kalman gain vector of order N: i.e. the ith element of $\hat{k}^N(t)$ is $\hat{k}_i^N(t) = \epsilon_{N-i,i-1}(t-i+1)$—see Equation (7). There are many possible ways of using the method described with reference to FIGS. 3 and 4 to generate the interpolation residuals which are the elements $\hat{k}_Q^N(t)$ (Q=1 to N) of the un-normalized Kalman gain vector $\hat{k}^N(t)$ for an Nth order adaptive filter.

For economy of description, the following discussion is in terms of a posteriori residuals, whereas equivalently in the present example a priori residuals and conversion factors are in fact used. Interpolation residuals $\epsilon_{p,0}(t)$ and $\epsilon_{0,f}(t-f)$ have a special property. The interpolation residual $\epsilon_{N-i,0}(t)$ has p=N−i and f=0: f=0 corresponds to there being no subsequent terms in the time series. This residual is therefore calculated only from preceding terms, i.e. from the same terms in the time series and in the same way as the forward prediction residual $$\varepsilon_{N-i}^F(t)$$

see Equation (14): these two residuals are therefore equal. Moreover, since the forward prediction residual can obtained using a least squares lattice processor, so also can the interpolation residual $\epsilon_{N-i,0}(t)$.

As stated there are many ways that the methods described with reference to FIGS. 3 and 4 can be utilised to generate the elements of the un-normalized Kalman gain vector $\hat{k}^N(t)$. For example, following the principle elicited above the interpolation residual $\epsilon_{N-i,0}(t)$ could be used to generate another interpolation residual with an f index increased by 1 and corresponding to the immediately preceding or (t−1)th time sample, namely $\epsilon_{N-i,1}(t-1)$; this procedure is repeated to produce $\epsilon_{N-i,2}(t-2)$ from $\epsilon_{N-i,1}(t-1)$. Iteration is repeated a total of (i−1) times until $\epsilon_{N-i,i-1}(t-i+1)$ is generated, i.e. the iteration stages are:

$$\epsilon_{N-i,0}(t) \Rightarrow \epsilon_{N-i,1}(t-1) \Rightarrow \epsilon_{N-i,2}(t-2) \Rightarrow \ldots \Rightarrow \epsilon_{N-i,i-1}(t-i+1) \quad (41)$$

An alternative method for generating $\epsilon_{N-i,i-1}(t-i+1)$ is as follows. The interpolation residual $\epsilon_{0,i-1}(t-i+1)$ (i.e. p=0, f=i−1) is the same as the (i−1)th backward prediction residual for time t: $\epsilon_{i-1}^B(t)$—see Equation (16). Following the principle elicited above the interpolation residual $\epsilon_{0,i-1}(t-i+1)$ is used to generate $\epsilon_{1,i-1}(t-i+1)$ with a p index increased by 1; this procedure is iterated to produce $\epsilon_{2,i-1}$ (t−i+1) from $\epsilon_{1,i-1}$(t−i+1). Iteration is repeated a total of (N−i) times until $\epsilon_{N-i,i-1}$(t−i+1) is generated, i.e.:

$$\epsilon_{0,i-1}(t-i+1) \Rightarrow \epsilon_{1,i-1}(t-i-1) \Rightarrow \epsilon_{2,i-1}(t-i+1) \Rightarrow \ldots \Rightarrow \epsilon_{N-i,i-1}(t-i,i-1). \quad (42)$$

The term $\epsilon_{N-i,i-1}$(t−i+1) is the ith element of the un-normalized Kalman gain vector $\hat{k}_i^N$(t).

The two methods indicated by iterations (41) and (42) above require of the order of $N^2$ ($O(N^2)$) computations to generate all of the required interpolation residuals making up the un-normalised Kalman gain vector, where N is the order of the adaptive filter. An alternative procedure will now be described to reduce the number of computations to $O(N\log_2 N)$.

For convenience of description it will be assumed that $N=2^x$, where N is the order of the filter and x is a positive integer. As described in connection with iterations (41) and (42), an interpolation residual of the kind $\epsilon_{p,f}$(t−f) such as $\epsilon_{M,M-1}$(t−M+1) (M=N/2) can be calculated by iteration starting from an interpolation residual $\epsilon_{M,0}$(t); because $\epsilon_{M,0}$(t) has p=M and f=0, it is derived from M preceding but 0 (no) succeeding time series data elements: it is therefore identical to the a posteriori forward prediction residual $\epsilon_M^f$(t) which is obtained from the same data elements by the same calculation. In consequence, $\epsilon_{M,M-1}$(t−M+1) is obtainable by iteration of the type shown in Equation (41) from $\epsilon_M^f$(t) itself obtained as described earlier from the least squares lattice processor. Furthermore, in the process of this iteration the residuals $e_{M,f}$(t−f) with values of f between 0 and M−1 are calculated, i.e. f=1 to M−2, namely:

$$\epsilon_{M,1}(t-1), \epsilon_{M,2}(t-2), \epsilon_{M,3}(t-3), \ldots, \epsilon_{M,M-2}(t-M+2) \quad (43)$$

The interpolation residuals in (43) are also intermediate quantities that would be calculated using the iteration shown in Equation (42) to calculate the residuals $\epsilon_{N-i,i-1}$(t−i+1) where ($2 \leq i \leq M-1$). Hence if the intermediate quantities at (43) are stored for later reuse it is possible to avoid some of the computation involved in calculating other residuals making up the un-normalised Kalman gain vector.

Similarly, the interpolation residual $\epsilon_{M-1,M}$(t−M) is obtainable by the iteration shown in Equation (42) from $\epsilon_{0,M}$(t−M), which itself is identical to the a posteriori backward prediction residual $\epsilon_M^B$(t): this iteration also generates intermediate quantities $\epsilon_{p,M}$(t−M) with values of p from 1 to M−2.

Similar savings are also possible for calculation of other terms, i.e. $\epsilon_{N-i,i-1}$(t−i+1) with values of i given by ($M+2 \leq i \leq N-1$) via iterations (41).

Storing intermediate quantities whilst calculating $\epsilon_{N-3P,3P-1}$(t−3P+1) from $\epsilon_{N-3P,M}$(t−M) (where P=N/4) gives a reduction in computation of residuals $\epsilon_{N-i,i-1}$(t−i+1) with values of i given by ($M+2 \leq i \leq 3P-1$) calculated via Equation (42). In total there are four such sets of computations, i.e. $\epsilon_{N-i,i-1}$(t−i+1) with values of i given by ($M+2 \leq i \leq 3P-1$), ($3P+2 \leq i \leq N-1$), ($2 \leq i \leq P-1$) and ($P+2 \leq i \leq M-1$). Furthermore these four set of computations can then be split in to eight in a similar manner and so on doubling repeatedly until N residuals needed for the Kalman gain vector are generated.

The procedure starts by calculating two elements of the un-normalised Kalman gain vector near its centre using the iteration approaches of (41) and (42). The Mth element $\epsilon_{M,M-1}$(t−M+1) is calculated via repeated use of Equation (41) starting from the forward residual $e_{M,0}$(t). The (M+1)th element $\epsilon_{M-1,M}$(t−M) is calculated by repeated use of Equation (42) starting from the backward residual $\epsilon_{0,M}$(t−M). It is not in fact essential to use these starting residuals but it is believed that they are the most economical ones to use in terms of the number of computations required.

Figure 5:
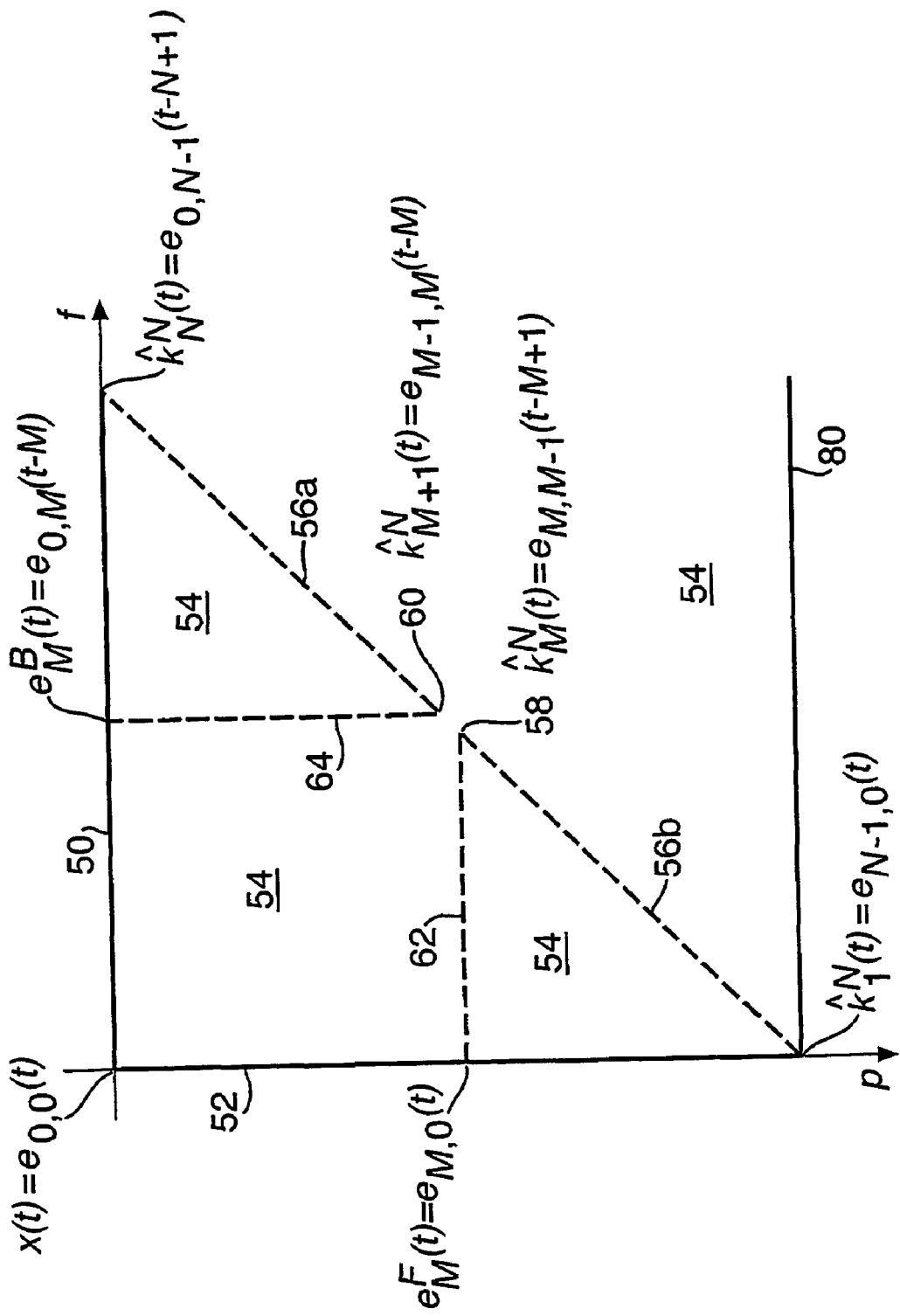
FIGS. 5 to 7 illustrate a "divide and conquer" approach to reducing computational load in a filter of the invention.

FIG. 5 graphically depicts interpolation residuals $\epsilon_{p,f}$(t−f) plotted against horizontal and vertical axes 50 and 52 in accordance with their f and p index values. Each point in the triangular space 54 represents an interpolation residual. The horizontal position of a point on the diagram and the associated f index value represent the number of future data samples used to generate the interpolation residual. The vertical position and the associated p index value represent the number of past data samples used to generate the interpolation residual. Values on the horizontal axis 50 are interpolation residuals with f=0 to N−1 and p=0, and therefore they are also backward prediction residuals $\epsilon_f^B$(t) obtained as previously described and for reasons given then. Similarly, values on the vertical axis 52 are interpolation residuals with f=0 and p=0 to N−1, and therefore they are also forward prediction residuals $\epsilon_p^F$(t) obtained as before.

The interpolation residuals required to be calculated are positioned on a diagonal dotted line 56 shown as line halves 56a and 56b—they are as has been said the elements $\hat{k}_Q^N$ of the un-normalised Kalman gain vector $\hat{k}^N$(t). The sequence of residuals generated in an iteration to calculate two residuals $\epsilon_{M,M-1}$(t−M +1) and $\epsilon_{M-1,M}$(t−M) at 58 and 60 collectively central to the diagonal 56 are shown as chain lines 62 and 64 respectively.

There are now two sub-problems, identical in principle to the original problem, but of order M=N/2: they are indicated by respective line halves 56a and 56b. The next step of the procedure is to calculate two pairs of elements, each pair collectively central to a respective line half 56a or 56b. Let N/4=M2=P. The Pth element of $\hat{k}^N$(t), i.e. $\epsilon_{3P,P-1}$(t−P+1) is calculated by iteration of Equation (41) starting from the forward residual $\epsilon_{3P,0}$(t).

The (P+1)th element of $\hat{k}^N$(t), i.e. $\epsilon_{3P-1,P}$(t−P) is calculated by iteration of Equation (42) staring from the interpolation residual $\epsilon_{M,P}$(t−P), which itself was calculated during the calculation of $\hat{k}_M^N = \epsilon_{M,M-1}$(t−M+1).

The 3Pth element of $\hat{k}^N$(t), i.e. $\epsilon_{P,3P-1}$(t−3P+1) is calculated by iteration of Equation (41) starting from the residual $\epsilon_{P,M}$(t−M).

The (3P+1)th element of $\hat{k}^N$(t), i.e. $\epsilon_{P-1,3P}$(t−3P) is calculated by iteration of Equation (42) starting from the residual $\epsilon_{0,3P}$(t−3P).

Figure 6:
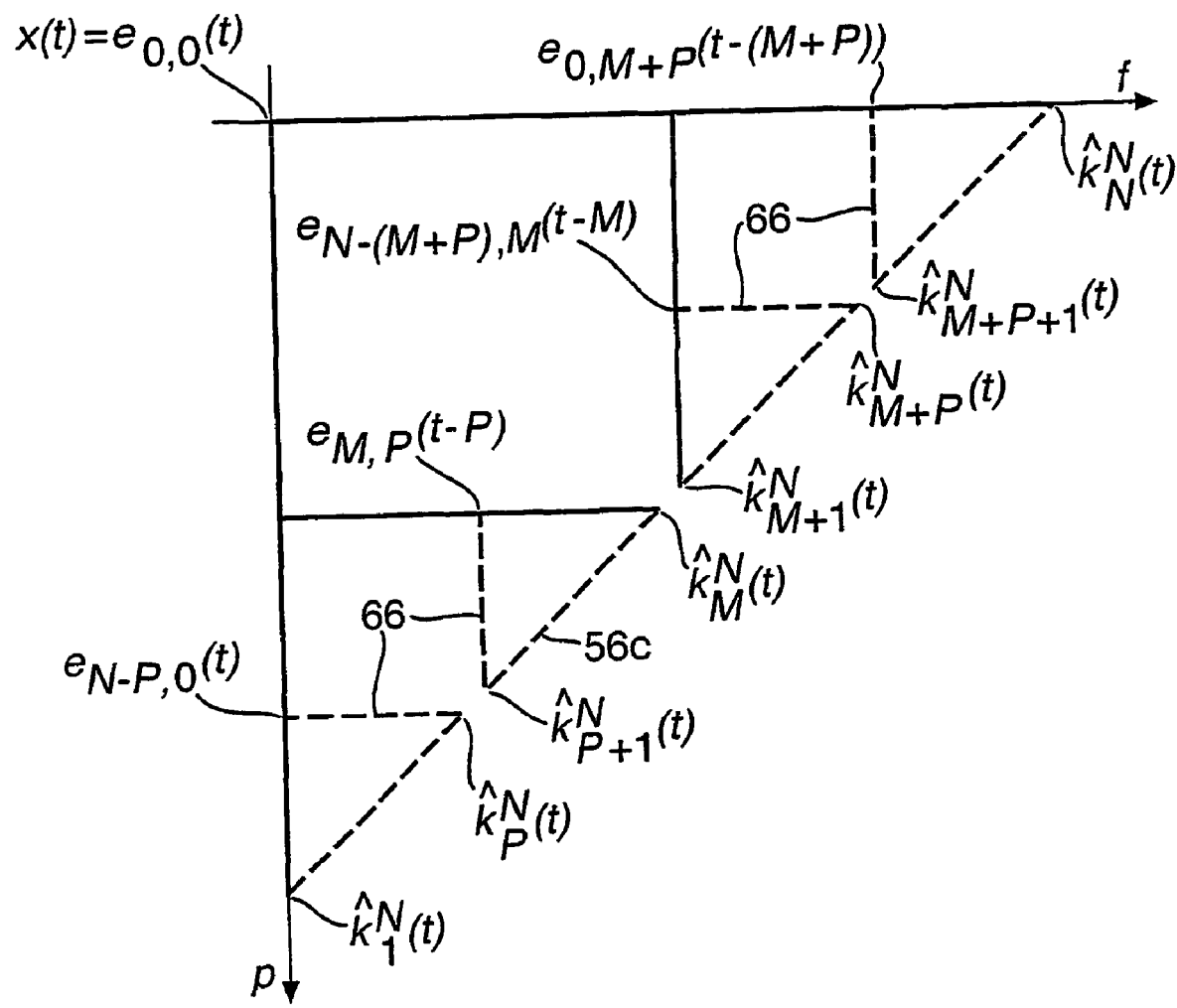

The evolution of the computation to this point is illustrated in FIG. 6, in which parts equivalent to those described earlier are like-referenced: four horizontal and vertical chain lines 66 have become added to this drawing as compared to FIG. 5 indicating calculation of four additional interpolation residuals or elements of the un-normalised Kalman gain vector.

FIG. 6 illustrates that there are now four sub-problems of order P, as indicated by four diagonal quarter lines such as 56c. This procedure of splitting each sub-problem into two half-sized sub-problems and evaluating two adjacent residuals at a line portion central region is continued until all elements of the un-normalised Kalman gain vector are calculated. It is referred to as a "divide and conquer" approach: it reduces the number of computations required from $O(N^2)$ to $O(N\log_2 N)$ because it is not necessary to evaluate residuals indicated by spaces between lines within the drawing.

Figure 7:
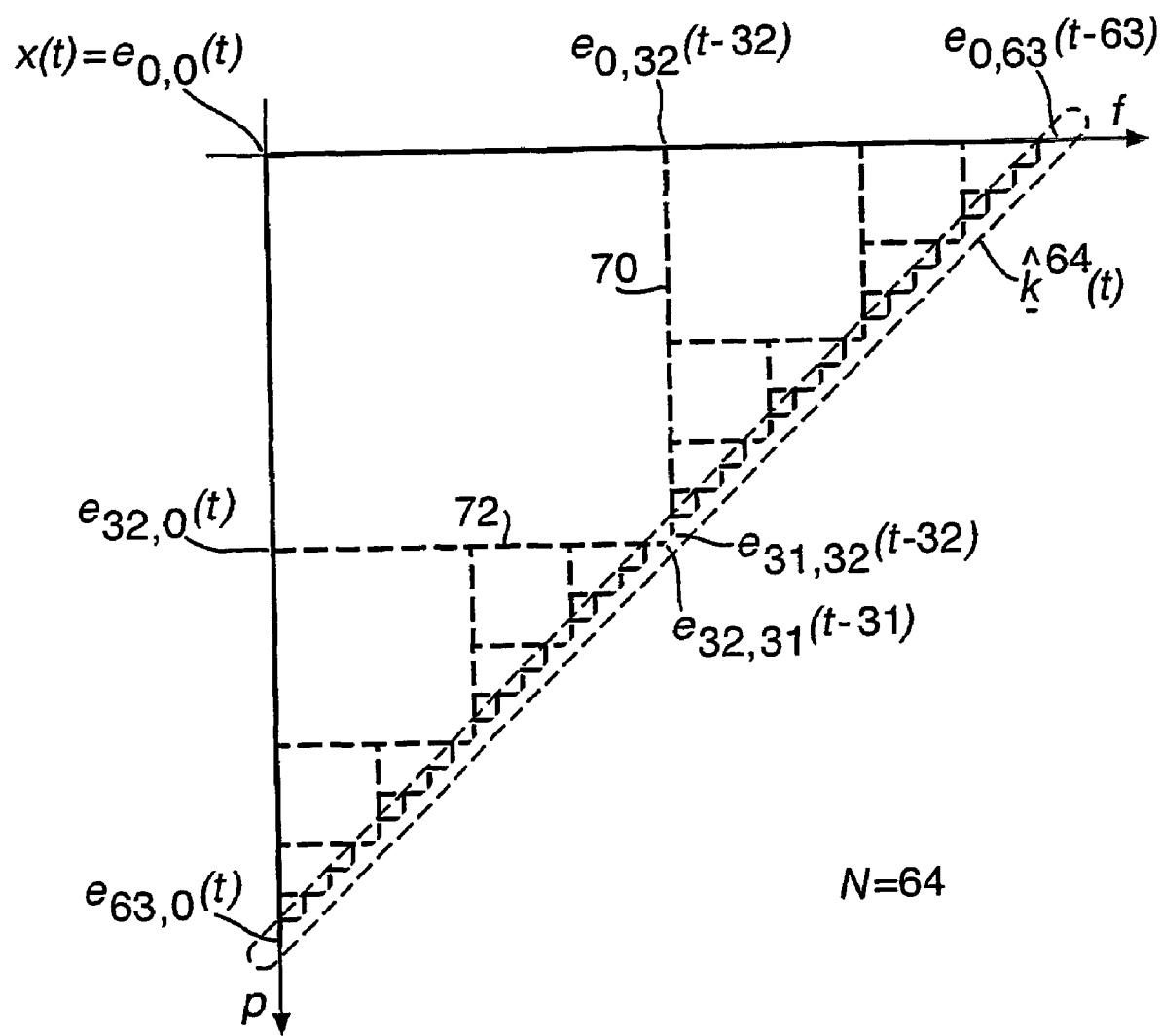

For the case N=64 the set of interpolation residuals actually calculated is illustrated in FIG. 7. As indicated earlier, vertical lines such as 70 indicate residuals iterated downwards using Equation (42) and horizontal lines such as 72 indicate residuals iterated to the right using Equation (41).

From inspection of FIG. 7, it is seen that the general approach is to generate two orthogonal lines of residuals, select a residual approximately half way along each line and iterate orthogonally to the direction of the line, generating a respective new line of iterations until the required value of the un-normalised Kalman gain vector is reached. This procedure is repeated using residuals approximately half way to previously selected residuals and also using residuals approximately half way along each new line of iterations.

Strictly speaking, "half way along each line" is inaccurate because there is no residual at the half way point: instead the half way point is midway between two values and, in the case of the original prediction residuals (upon the uppermost and leftmost axes 50 and 52 in FIG. 5), on each side of the halfway point there are N/2 residuals (thirty-two for N=64). One begins an iteration with one of the two residuals immediately adjacent to and on opposite sides of a halfway point: the residual with which one begins is that having the higher value of the index which will not be incremented in the next iteration. This is not actually essential but it is believed to result in a numerically robust procedure with the smallest the number of iterative steps. In this connection, referring back to FIG. 6 once more, to produce the un-normalised Kalman gain vector the starting point was the forward prediction residual $\epsilon_{M,0}(t)$ and iteration was carried out for M-1 steps until the second or $f$ index (initially zero) became M-1. One could also begin with the backward prediction residual $\epsilon_{0,M-1}(t)$ and iterate until the first or p index becomes M, but this requires one more iteration and does not help the "divide and conquer" process. Later iterations begin similarly with a residual immediately adjacent a halfway point and having a higher value of the index not to be incremented, and the relevant halfway point is halfway between an interpolation residual providing a value of $k_Q^N(t)$ obtained earlier and a starting residual for an earlier iteration.

For filters with order N not equal to an integer power of two, the divide and conquer principle described above dan still used but the problem is divided up in a different way. Splitting each problem into two equal sub-problems will no longer be wholly appropriate to give a complete solution. A problem or sub-problem can be split into two or more not necessarily equal sub-problems: e.g. N=48 could be split into sub-problems of order 32 and 16 one of which yields 32 weight vector elements and the other 16. Any integer value of N can be treated as a sum of numbers each of which is a power of two and yields a subset of the required weight vector elements: hence the problem could be solved in this way. Many other "divide and conquer" schemes are possible based on the many different ways of dividing filter weight vectors with order N not equal to an integer power of two into sub-weight-vectors with unequal orders.

Referring to Stage 16 of FIG. 1 the jth element of the Kalman gain vector is calculated using Equation 7: in this equation the numerator is an a posteriori interpolation residual $\epsilon_{N-j,j-1}(t-j+1)$ which is the jth element of the un-normalised Kalman gain vector. The a posteriori residual will have been calculated as in FIGS. 3 and 4 as an a priori residual $e_{N-j,j-1}(t-j+1)$ and a conversion factor $\delta_{N-j,j-1}(t-j+1)$.

The a posteriori residual itself is calculated as $$\epsilon_{N-j,j-1}(t-j+1)=e_{N-j,j-1}(t-j+1)\delta_{N-j,j-1}(t-j+1) \quad (44)$$

The denominator in Equation 7 is of the form $E_{N-j,j-1}(t-j+1)$ which is updated at each iteration by $$E_{N-j,j-1}(t-j+1)=\beta_3^2 E_{N-j,j-1}(t-j)+e_{N-j,j-1}(t-j+1)\epsilon_{N-j,j-1}(t-j+1) \quad (45)$$

Figure 8:
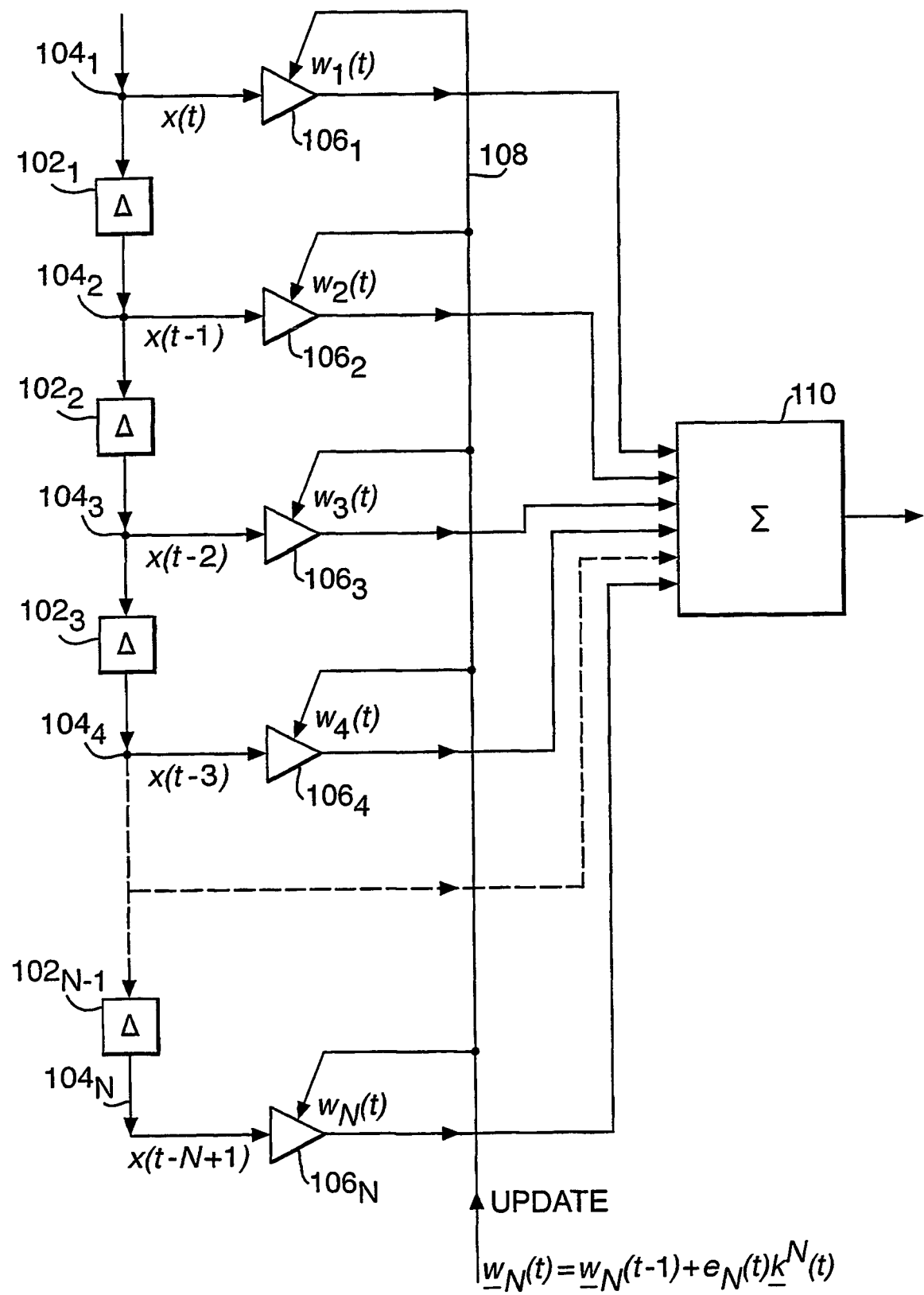
FIG. 8 illustrates weight updating in a hardware version of the invention.

Referring now to FIG. 8, an Nth order adaptive filter is shown implemented electronically. It consists of a chain of delay cells $102_1$, to $102_{N-1}$ connected in series between respective pairs of connection nodes $104_1$, to $104_N$. These nodes are connected to respective amplifiers $106_1$, to $106_N$ with respective amplification factors $w_1(t)$ to $w_N(t)$ and connected to an update bus 108. The amplifiers 106 provide output to a summer 110.

Each delay cell 102 provides a delay equal to the time between successive values of an input signal sample x(t) input to the first node $104_1$, first delay cell $102_1$, and first amplifier $106_1$. Upon clock activation it outputs a signal sample input x(t-1) received on an immediately preceding clock cycle and inputs a new signal sample x(t). In consequence, when x(t) is input to the first cell $102_1$ and first amplifier $106_1$, the ith (i=2 to N-1) cell $102_1$, and ith amplifier $106_i$ (i=2 to N) receive input of x(t-i+1). The amplifiers have respective gain factors which collectively apply a weight vector to the signals x(t) to x(t-N+1): i.e. the ith amplifier $106_i$ has a gain of $w_i(t)$ a time t and produces an output $w_i(t)x(t-i+1)$. The summer 110 sums the amplifier outputs, i.e. its output $S_0$ is:

$$S_0 = \sum_{i=1}^{N} w_i(t)x(t-i+1) \quad (46)$$

which is the required adaptive filter output as in Equation (1). The weights $w_i(t)$ are updated via the update bus 108 in accordance with Equations (3) and (4) given earlier.

Provided the Kalman gain vector is known, the equations given in the foregoing description can clearly be evaluated by an appropriate computer program comprising program instructions recorded on an appropriate carrier medium and running on a conventional computer system. The carrier medium may be a memory, a floppy or compact or optical disc or other hardware recordal medium, or an electrical signal. Such a program is straightforward for a skilled programmer to implement from the foregoing description without requiring invention, because it involves well known computational procedures. An outline for a program to calculate the Kalman gain vector will now be described assuming $N=2^x$ where x is a positive integer. The code is written using the rules of the MATLAB® computer program: the semicolon (;) indicates the end of an instruction, the epsis ( . . . ) indicates the instruction continues on the next line, the symbol '.*' indicates element-wise multiplication of two vectors: element-wise multiplication of two vectors a and b having respective elements $a_i$, $b_i$ is defined as forming a vector c with an $i^{th}$ element $c_i$ equal to the product $a_i b_i$ of like-indexed pairs of elements $a_i$, $b_i$(i=1, 2, 3, . . . etc).

The Nth order un-normalised Kalman gain vector (the symbol 'k' below) at a given time instance is given by the four line program. The conversion of the un-normalised Kalman gain vector into the true (i.e. normalised) Kalman gain vector according to Equation (10) is straightforward for a skilled programmer to implement without requiring invention, because it involves well known computational procedures.

[km, deltakm, store state]=interpolate (N, fr, br, deltaf, deltab, fr, br, beta, store, state);
kp=[fr(N), km, br (N)];
deltak=[deltaf(N), deltakm, deltab(N)];
k=kp .* deltak;

where the N-dimensional vectors 'fr' and 'br' contain the a priori forward and backward predictions residuals of order 0 to N−1 for that time instance, deltaf, deltab are N-dimensional vectors containing the corresponding conversion factors linking the a priori residuals to the a posteriori residuals (the a posteriori residual is equal to the product of the a priori residual and the conversion factor) and the variables 'store' and 'state' are used to store intermediate quantities and are arrays of dimension N×N×2 and N×N×4 respectively. The forward and backward prediction residuals and the conversion factors can be produced as previously described using for example a QRD-based LSL program. The intermediate quantities 'store' and 'state' need to be initialised before running the program for the first time. This will be described later.

Defining n=2m and m being an integer not less than 2, the function 'interpolate' calculates an (n−2)-dimensional vector of interpolation residuals that constitute the diagonal of a triangular region in the space depicted in FIG. 4 defined by the horizontal line 50 and the vertical line 52. The two residuals near the centre of the diagonal are calculated using the recursions (41) and (42) via calls to the functions 'across' and 'down'. If n is greater than 4, the remaining diagonal elements are calculated by two further (recursive) calls to the function 'interpolate' consisting of data of dimension n/2 (the "divide and conquer" technique). The function 'interpolate' is:

function [k, deltak, store, state]=interpolate(n, v, h, deltav, deltah, fr, br, beta, store0, state0) store=store0; state=state0;
if (n>4)
  [v1, deltav1, state(1:n/2,n/2+1,:)]= . . . down(n/2, h(n/2+1), deltah(n/2+1), br(n/2+1:n), beta, state(1:n/2,n/2+1,:));
  [h1, deltah1, store((n/2+1),1:(n/2),:), state((n/2+1),1:(n/2),:)]= . . . across(n/2, v(n/2+1), deltav(n/2+1), fr((n/2+1):n), beta, store((n/2+1),1:(n/2),:), . . . state ((n/2+1),1:(n/2),:));
  [ku, deltaku, store(1:n/2,n/2+1:n,:), state(1:n/2,n/2+1:n,:)]= . . . interpolate(n/2, v1, h(n/2+1:n), deltav1, deltah(n/2+1:n), fr(n/2+1:n), br(n/2+1:n), . . . beta, store(1:n/2,((n/2)+1):n,:), state(1:n/2,n/2+1:n,:));
  [k1, deltak1, store(n/2+1:n,1:n/2,:), state(n/2+1:n,1:n/2,:)]= . . . interpolate(n/2,v(n/2+1:n),h1, deltav(n/2+1:n), deltah1, fr(n/2+1:n), br(n/2+1:n), . . . beta, store(((n/2)+1):n,1:n/2,:), state(n/2+1:n,1:n/2,:));
  k=[k1, h1(n/2), v1(n/2), ku];
  deltak=[deltak1, deltah1(n/2), deltav1(n/2), deltaku];
else
  [v1, deltav1, state(1:n/2,n/2+1,:)]= . . . down(n/2, h(n/2+1), deltah(n/2+1), br(n/2+1:n), beta, state(1:n/2,n/2+1,:));
  [h1, deltah1, store(n/2+1,1:n/2,:), state(n/2+1, 1:n/2,:)]= . . . across(n/2, v(n/2+1), deltav(n/2+1), fr(n/2+1:n), beta, store(n/2+1,1:n/2,:), state(n/2+1,1:n/2,:));
  k=[h1(n/2), v1(n/2)];
  deltak=[deltah1(n/2), deltav1(n/2)];
end The function 'down' implements the iteration (42) i.e. starting from a residual of the form $\epsilon_{p,f}(t-f)$ (actually represented by the a priori residual $h=e_{p,f}(t-f)$ and the conversion factor $delta0=\delta_{p,f}(t-f)$) and produces the sequence of residuals $\epsilon_{p+i,f}(t-f)$ for i=1 to n−1 (again, represented by a priori residuals and conversion factors stored in v and delta1 respectively).

The function 'update' is common to the function 'across' both of which are described below. The function 'down' is
function [v, delta11, state]=down (n, h, delta0, br, beta, state0) state=state0;
v(1)=h; delta1(1)=delta0;
for i=2:n,
  [v(i), delta1(i), state(i,1,:)]=update (v(i−1), delta1(i−1), br(i), beta, state(i,1,:));
end The function 'across' implements iteration (41) i.e. starting from a residual of the form $\epsilon_{p,f}(t-f)$ (actually represented by the a priori residual $v=e_{p,f}(t-f)$ and the conversion factor $delta0=\delta_{p,f}(t-f)$) and produces the sequence of residuals $\epsilon_{p,f+i}(t-f-i)$ for i=1 to n−1 (again, represented by a priori residuals and conversion factors stored in h and delta1 respectively). Extra storage is needed compared to the function 'down' in order to implement the change in time index. The function 'update' is common to the function 'down' and is described below. The function 'across' is
function [h, delta1, store, state]=across(n, v, delta0, fr, beta, store0, state0) state=state0; store=store0;
h(1)=v; delta1(1)=delta0;
for i=2:n,
  [h(i), delta1(i), state(1,i,:)]=update (store(1,i,1), store (1,i,2), fr(i), beta, state(1,i,:));
  store(1,i,:)=[h(i−1), delta1(i−1)];
end The function 'update' takes a residual $\epsilon_{p,f}(t-f)$ (actually represented by the a priori residual $x=e_{p,f}(t-f)$ and the conversion factor $delta=\delta_{p,f}(t-f)$) and increases either the index 'f' or the index 'p' by one depending upon the value of the input 'r'. No 'switching' is required: if 'r' is the appropriate backward prediction residual then the index 'p' is increased (see Equations (24) and (33)); conversely if 'r' is the appropriate forward prediction residual then the index 'f' is increased (see equations (25) and (34)). As described earlier this requires that an RLS and a modified RLS problem be solved This is done in the functions 'rls' and 'mrls' respectively. The function 'update' is
function [y, delta1, state1]=update (x, delta, r, beta, state)
  d=state(1); k=state(2);
  dm=state(3); km=state(4);
  [z,dm1,km1]=mris (x, r, delta,dm,beta,km);
  [y,delta1,d1,k1]=ris (z, x,delta,d,beta,k);
  state1(1)=d1; state1(2)=k1;
  state1(3)=dm1; state1(4)=km1;

The function 'rls' solves a RLS problem as described in Equations (28) to (32) inclusive. The function 'rls' is
function [z,delta1,d1,k1]=ris (x, y,delta,d,beta,k)
  if ((x==0)|(delta==0))
    d1=beta^2*d;
    s=0;
    delta1=delta;
  else
    d1=beta^2*d+delta*abs(x)^2;
    s=delta*x/d1;
    delta1=beta^2*delta*d/d1;
  end
  z=y+k*x;
  k1=k−s*z;

The function 'mrls' solves a modified RLS problem as described in Equations (36) to (40) inclusive. The function 'mrls' is

```
function [y,d1,k1]=mris (x, z,delta,d,beta,k)
   if ((x==0)|(delta==0))
      d1beta^2*d;
      s=0;
   else
      d1=beta^2*d+delta*abs(x)^2;
      s=delta*x/d1;
   end
   y=z-k*x;
   k1=k-s*z;
```

In the above program listing and in the description of the associated mathematics, there are certain quantities that are updated from time instance to time instance e.g. $k(t-1) \rightarrow k(t)$. Hence an initial value must be specified. An example of a way to perform this initialisation is as follows: Firstly, all stored variables involved in the computation are set to zero with the exception of the stored conversion factors which are set to unity. Then the program or hardware instantiation, up to but not including the normalisation stage, is arranged to process an initialising input time series consisting of a one followed by N zeros, where as before N is the order of the digital filter. This procedure gives appropriate initial values as required, after which a real time series can be processed.

In recent years a new type of algorithm (termed a 'Fast Newton' algorithm) has appeared in the academic literature: see e.g.

M. Moonen and I. K. Proudler, "Using a Lattice Algorithm to Estimate the Kalman Gain Vector in Fast Newton-type Adaptive Filtering", Proc. ICASSP'97, Munich, April 1997

G. V. Moustakides & S. Theodoridis, "Fast Newton Transversal Filters—A New Class of Adaptive Estimation Algorithms", IEEE trans. SP-39(6); pp. 2184-2193. 1991.

D. K. Phillips and C. F. N. Cowan, "Zero-Phase Signal Conditioning for Improved NLMS Performance", 13th Int. Conf. on DSP, 2-4 Jul. 1997, Santorini, Greece, pp.37-39.

K. Maouche and D. T. M. Slock, "A Fast Instrumental Variable Affine Projection Algorithm", Proc. ICASSP'98, Seattle, Wash., USA, pp. 1481-4.

Fast Newton algorithms are based on RLS algorithms and on an assumption that the input signal to be filtered can be modelled as a low order autoregressive (AR) process. This assumption allows some of the computation in the RLS algorithm to be ignored with potentially very little loss in convergence performance but a large saving in computation. In accordance with the invention it has been discovered that in order for this approach to be viable it is necessary for the RLS algorithm in use to be of a type that produces filter coefficients explicitly—which excludes the use of RLS lattice algorithms known before this invention.

It is also advantageous, especially in acoustic applications, for the algorithm to be convertible into a Fast Newton (U) algorithm in order to be able to take advantage of any autoregressive nature in the input signal. It can be shown that the present invention is suitable for implementation using an FN approach.

The invention is suitable for use in a variety of applications: such applications for adaptive filters are given by S Haykin, Adaptive Filter Theory, 2nd Edition, Prentice-Hall, Englewood Cliffs, N.J., USA, 1991. One such is system identification—here the requirement is to observe a real system and generate a computer model of its operation. The model can be used for many things such as health monitoring, developing a control system or to design a distortion compensation processor (e.g. for manipulating the acoustic character of rooms). System identification is achieved by monitoring the input and output of the system and feeding these signals as input data in digital electronic form to the adaptive filter implemented on a computer system. Although not strictly necessary, having the filter weights rather than some other parameterisation of the system is usually considered desirable as they are easier to interpret and manipulate.

Adaptive filters are also applicable to communications channel equalisation: in modem digital communication systems a high data rate is often a requirement, where 'high' means high having regard to the maximum data rate of the communications channel in use. Individual data bits in the system may be sent so close together that their signal wave forms merge due characteristics of the communications channel. This adversely affects the ability of a receiver in the system to recover the information correctly. The standard approach is to 'equalise' the channel. This can be done either via a channel equalisation filter (an adaptive filter) or via Maximum Likelihood Sequence Estimation (usually implemented using the Viterbi algorithm). Such equalisation is needed, for example, in the GSM mobile telephone system, digital TV transmissions over cable networks, and data modems for telephone lines.

One of the most effective equalisation filter structures is the 'Decision Feedback Equaliser'. It uses previous decoding decisions (assumed to be correct) to counteract communications channel effects. It requires the ability to filter received signals independently of any updating mechanism for filter weights. Obtaining the filter weights rather than some other parameterisation of the filter makes this task easier to implement.

Maximum Likelihood Sequence Estimation is a very powerful means of equalising a communications channel and is used in the GSM mobile telephone system. Unlike channel equalisation filtering, it works by directly estimating a transmitted information signal in a communications channel: to achieve this an estimate of the distortion introduced by the channel is required and can be provided by an adaptive filter (cf. system identification above). Again it is desirable to model the communications channel directly in terms of filter weights, as opposed to a less direct approach.

In some applications, e.g. data modems for telephone lines, although the appropriate equalisation filter is unknown a priori and hence must be determined by an adaptive filter, once it is known it changes little with time. Here there is little point in continually updating the filter weights. The simplest alternative is to separate filtering from calculation of filter weights (sometimes called 'offline processing') so that the latter is, done only when required. This gives an additional advantage for high speed data, when calculation of filter weights does not need to cope with the data rate even though filtering must do so. Again, obtaining the filter weights themselves rather than some other filter parameterisation makes this approach easier to implement.

In contrast to the aforementioned unknown but unchanging case, in some situations, for example HF radio communication, communication channel properties may vary with time requiring continual updating of equalisation filter weights. This may be achieved in two basic ways: by the use of either recursive or block adaptive filters. A recursive adaptive filter continually updates filter weights as new data arrives. A block adaptive filter partitions data into blocks and processes each block independently of the others. Recursive adaptive filters may be required to process many millions of data samples, and it is therefore vital that they behave correctly even when implemented with computer arithmetic circuits. Block adaptive filters are less susceptible to this problem since each data block represents only a limited amount of data to be processed at one time. However block adaptive filters have several drawbacks such as extra storage requirements for the blocks of data and the need for smooth 'joining' of the resulting processed blocks of data together.

Constrained adaptive filters are known. They have a variety of applications such as minimum variance spectral analysis and for processing data from antenna arrays. Here an adaptive filter is required to minimise some signal subject to a constraint on the filter weights such as zero response at a particular frequency. Such adaptive filters can be updated efficiently using the Kalman gain vector. The relevant parts of the invention described herein can thus be used in a constrained adaptive filter.

In the example of the invention described with reference to FIG. 1 et sequi, the adaptive filter is shown as consisting of four blocks: RLS Lattice Algorithm 12, Interpolation Residual Calculation 14, Normalisation 16, and Weight Update 18: highly detailed examples of the blocks 12 to 18 have been described in the embodiment of the invention hereinbefore set out. However, with the benefit of the embodiment described it will be clear to those of ordinary skill in the art of filtering that there are many different ways in which the blocks 12 to 18 can be implemented.

The embodiment described herein derives the Kalman gain vector itself, ignoring arithmetic inaccuracies, i.e. rounding errors. It is known that adaptive filters are realisable (possibly with reduced performance) if the Kalman gain vector is replaced by an approximation to it provided by one of a variety of alternative gain vectors: see e.g. the literature on Fast Newton Algorithms referred to above. The advantage of these alternative gain vectors is that they can be calculated with fewer operations than the Kalman gain vector.

In the example of the invention, the first step of generating interpolation residuals is to generate least squares (LS) prediction residuals via a recursive LS Lattice (RLSL) algorithm. The RLSL algorithm could be replaced by any other method of generating prediction residuals. Other algorithms which could be used to generate LS prediction residuals are RLS algorithms such as the Conventional RLS algorithm, the Fast Transversal Filter FTF) algorithm or the QR RLS algorithm.

One could also use Non-RLS algorithms such as the Least Mean Squares GEMS) algorithm, the Gradient Adaptive Lattice (GAL) algorithm, a Clamped LSL algorithm or a Fast Newton Transversal Filter (FNTF) algorithm. In this case (at least some of) the residuals would be approximate RLS prediction residuals. The use of a non-RLS algorithm will lead to a gain vector that is not identical to the Kalman gain vector.

Prediction residuals need not be the only input to interpolation residual calculation at 14 in FIG. 1. The basis of interpolation residual calculation 14 is that iterations increase interpolation residuals' order—their p and f subscripts. Prediction residuals correspond to p=0 or f=0, and hence are possible starting variables. Clearly one can begin from any suitable set of variables. For example, a set of interpolation residuals with p=1, and a set of residuals with f=1, could be calculated (or approximated) by any means, and these could then be used to generate the desired interpolation residuals which make up the un-normalised Kalman gain vector. One could use for example the recursive interpolation algorithm given by J T Yuan, "QR decomposition based least squares lattice interpolators", IEEE Trans SP January 2000 vol 48(1) pages 70-79.

By suitable mathematical manipulation of Equations (24) and (25), it is also possible to envisage the calculation of interpolation residuals by iterations that decrease the interpolation residuals' order—their p and f subscripts. Hence the residuals that constitute the un-normalised Kalman gain vector could be obtained from many other residuals as starting variables. In particular it is possible to replace the divide and conquer structure in Stage 14 of FIG. 1 with a concatenation of processing stages which "zig-zag" (see FIG. 5) from the first element to the last element of the un-normalised Kalman gain vector. The set of residuals generated between these two extremes can include the residuals corresponding to all other elements of the un-normalised Kalman gain vector. This method requires fewer operations than the divide and conquer process used in the preferred embodiment but has not been used therein because it has inferior numerical properties when performed using finite precision arithmetic.

There are several options for generating the un-normalised Kalman gain vector other than the divide and conquer approach described above. For example the same vector could be calculated from Equation (42) starting from backwards prediction residuals. This would require $O(N^2)$ operations as opposed to the $O(N\log_2 N)$ operations of the divide and conquer method. An interpolation residual may be calculated using basic iterations (whereby the order of the interpolation residuals (the p and f subscripts) is increased by one) from an interpolation residual with lower indices via a variety of routes. If RLS iterations are used the result is substantially the same regardless of the route taken.

There are therefore many potential sets of iterations which may be performed to generate the un-normalised Kalman gain vector. Furthermore, there is a whole range of other vectors which could be generated instead of the un-normalised Kalman gain vector. The Kalman gain vector is the vector used to update the filter weights in a RLS algorithm. There are many other gain vectors which could be used to update the filter weights other than the Kalman gain vector. An algorithm with a gain vector which is close to the Kalman gain vector is expected to perform similarly to a RLS algorithm.

Approximations to the Kalman gain vector could be generated for example by replacing some (or all) of the iterations which increase the interpolation order by computationally cheaper iterations. For example, the iterations could be replaced by their LMS equivalents, or any other approximations. In some cases the computation could reduce to merely a time delay or nothing at all (NB this is based on the same underlying idea behind the 'Fast Newton' algorithm mentioned above). This is equivalent to making the approximation that a higher order interpolation residual is equal to a lower order interpolation residual.

Referring to FIG. 5 once more, a second possibility is that, rather than trying to calculate the interpolation residuals on the diagonal 56a/56b, one could use instead the residuals that form a horizontal line 80 starting from the bottom-left element of the Kalman gain vector. This corresponds to a vector consisting of the elements $\epsilon_{N-1,f}(t-f)$ with $f=0, \ldots, N-1$.

In the example the un-normalised Kalman Gain vector is normalised by dividing each element of the vector by its power; The power of each residual which is an element of the un-normalised Kalman Gain vector is calculated via Equation (10). This quantity could be approximated for example from just the a priori residuals or the a posteriori residuals or via many other means. Alternative normalisation factors could be used to alter an algorithm's convergence characteristics: for example choosing a larger normalisation factor will slow down convergence, but it allows filter weights to become closer to their ideal values once converged.

The foregoing example is based on the Kalman gain vector defined by Equation (5). In the prior art RLS algorithms are known that use the so-called "dual Kalman-gain vector". This is a scaled version of the Kalman gain vector which is based on normalised a priori interpolation residuals rather than a posteriori residuals. It requires a slightly modified weight updating formula but it is also an RLS algorithm. Approximations (such as those mentioned above) to the dual Kalman-gain vector could also be used.

As described above in detail, it has been discovered in accordance with the invention that a Kalman gain vector can be derived as a set of normalised interpolation residuals which can be used in an $O(Nlog_2N)$ adaptive filter. However, the Kalman gain is an integral part of one form of the ubiquitous recursive least squares (RIS) procedure. Apart from applications such as noise cancellation and communications channel equalisation which use adaptive filtering, the filtering procedure (and approximate alternatives) can be used in adaptive beamforming. It can also be used to construct multichannel adaptive filters which are sometimes used in sonar applications where they are known as broadband beamformers. The residuals that make up the Kalman gain vector are conventionally referred to in recent prior art as "interpolation residuals" only if the data being processed is in the form of a time series. If data is taken from a set of spatial distributed sensors for example, corresponding residuals do not have an accepted common descriptive name even though the basic signal processing approach still holds good For the purposes of the present invention, the expression "interpolation residual" shall be taken as referring to residuals obtained by interpolation from a sequence of data elements distributed over any dimension without limitation, i.e. time or space or any other.

Although it is as yet unverified for all practical situations, from theoretical considerations it is believed that—where filter parameters are updated using Equation (3)—calculating the Kalman gain vector via interpolation residuals is numerically more robust than a conventional approach with similar computational requirements.

The foregoing example used real valued data. The invention can also be applied to complex valued data such as in-phase and quadrature (I and Q) channels of data used in digital communications or radar systems.

Whereas it is preferred to obtain the Kalman gain vector with a divide-and-conquer approach of $O(Nlog_2N)$ operations, it is quite possible to use some other method to obtain interpolation residuals such as one of the $O(N^2)$ methods described earlier if the resulting increase in number of operations is acceptable: The latter will still have an advantage because as indicated above for good theoretical reasons it is likely to be more numerically robust than alternative approaches.

The invention claimed is:

1. An adaptive filter implemented by means of filter weights, the filter including means for providing a sequence of signal samples for application to the filter and means for updating the filter weights by means of a gain vector derived from interpolation residuals of the sequence of signal samples applied to the filter.

2. A method for adaptive filtering with filter weights comprising the steps of:
   a) deriving interpolation residuals from a sequence of signal samples provided as data for filtering, and
   b) updating the filter weights with a gain vector derived from the interpolation residuals.

3. A method according to claim 2 wherein the gain vector is a Kalman gain vector.

4. A method for adaptive filtering including:
   a) processing an input sequence of signal samples to derive prediction residuals;
   b) converting prediction residuals to interpolation residuals;
   c) deriving elements of a gain vector from the interpolation residuals; and
   d) combining the gain vector with input and reference signals and update the filter coefficients or weights as required to provide adaptive filtering.

5. A method according 4 claim wherein the prediction residuals are least squares prediction residuals.

6. A method according to claim 5 for obtaining prediction residuals by processing a sequence of signal samples using a recursive least squares lattice (RLSL) algorithm.

7. A method according to claim 4 including converting prediction residuals to interpolation residuals corresponding to gain vector elements by an iterative approach in which each iteration changes an index of a residual or of an intermediate quantity derived therefrom.

8. A method according to claim 7 wherein the iterative approach is a divide and conquer approach which treats prediction residuals as interpolation residuals and changes the index appropriately to convert the prediction residual to an interpolation residual providing an element of the gain vector in un-normalised form.

9. A method according to claim 8 wherein the prediction residuals are least squares prediction residuals and the iterative approach treats the prediction residuals as interpolation residuals with zero values for one of two indices corresponding to absence of succeeding and preceding time series signal samples respectively and changes the zero index in each case sufficiently to convert the forward or backward residual to an interpolation residual which is also an element of the gain vector in un-normalised form.

10. A method according to claim 7 wherein the iterative approach also treats as an intermediate result an iteration in a sequence thereof leading to an element of the gain vector and changes an index of the intermediate result sufficiently to convert such result to an interpolation residual corresponding to an element of the gain vector.

11. A method according to claim 10 implementing a digital filter of order N where N is equal to $2^x$ and x is an integer, including iteration in a sequence to generate an un-normalised element of the gain vector, the iteration beginning with use of one of two residuals immediately adjacent and on opposite sides of a halfway point, the residual of use being that having a relatively higher value of an index not to be altered in the iteration sequence, and the relevant halfway point being halfway between two sequence, and the relevant halfway point being halfway between two quantities:
   e) one of which is an interpolation residual and the other a member of the relevant time series for which the gain vector is generated, or
   f) one of which is an interpolation residual and the other a starting point for an earlier iteration, or
   g) which are respectively starting and end points for an earlier iteration.

12. A method according to claim 10 implementing a digital filter of order N where N is equal to a sum of integers each of which is a power of two, wherein the iterative approach involves treating the filter as a combination of filters each of order a respective power of two.

13. A method according to claim 12 including iteration in a sequence to generate an un-normalised element of the gain vector, the iteration beginning with use of one of two residuals immediately adjacent and on opposite sides of a halfway point the residual of use being that having a relatively higher value of an index not to be altered in the iteration sequence, and the relevant halfway point being halfway between two sequence, and the relevant halfway point being halfway between two quantities:
   h) one of which is an interpolation residual and the other a member of the relevant time series for which the gain vector is generated, or
   i) one of which is an interpolation residual and the other a starting point for an earlier iteration, or
   j) which are respectively starting and end points for an earlier iteration.

14. A method according to Claim 4 including converting prediction residuals to interpolation residuals corresponding to elements of a gain vector by a QR decomposition approach in which equations of the form:
   k) $\zeta(i)=\psi(i)+k(i)\xi(i)$ are solved for $\zeta(i)$ and $k(i)$ given $\psi(i)$ and $\xi(i)$ subject to a constraint that in so doing there is minimisation of a sum of squares of $\psi(j)+k(i)\xi(j)$ obtained for different sample indexes j, where $\zeta(i)$ is an a posteriori interpolation residual, $\psi(i)$ and $\xi(i)$ are a posteriori modified prediction and interpolation residuals respectively, and $k(i)$ is a coefficient to be determined;
   l) $\psi(i)=\zeta(i)-k(i)\xi(i)$ are solved for $\psi(i)$ and $\xi(i)$ $k(i)$ given $\zeta(i)$ and $\xi(i)$ subject to a constraint that in so doing the value of $k(i)$ that is obtained is substantially that which would be obtained in solving $\zeta(i)=\psi(i)+k(i)\xi(i)$ for $\zeta$ and $k(i)$.

15. A method according to claim 14 wherein the QR decomposition employs square root free equivalents of sine and cosine rotation parameters.

16. A computer software product comprising a computer readable medium containing computer readable instructions for controlling operation of computer apparatus to implement an adaptive filter, wherein the computer readable instructions provide a means for controlling the computer apparatus to input a sequence of signal samples as data for filtering, and the computer readable instructions also provide a means for controlling the computer apparatus to generate updated filter weights by means of a gain vector derived from interpolation residuals of sequence of signal samples.

17. A computer software product according to claim 16 wherein the gain vector is a Kalman gain vector.

18. A computer software product comprising readable medium containing computer readable instructions for controlling operation of computer apparatus to implement an adaptive filter wherein the computer readable instructions provide a means for controlling the computer apparatus to:
   m) process an input sequence of signal samples to derive prediction residuals;
   n) convert prediction residuals to interpolation residuals corresponding to elements of a gain vector; and
   o) derive elements of a gain vector from the interpolation residuals; and
   p) combine the gain vector with input and reference signals and update the filter coefficients or weights as required to provide adaptive filtering.

19. A computer software product according to claim 18 wherein the prediction residuals are least squares prediction residuals.

20. A computer software product according to claim 18 wherein the computer readable instructions provide a means for controlling the computer apparatus to obtain prediction residuals by processing a sequence of signal samples using a recursive least squares lattice (RLSL) algorithm.

21. A computer software product according to claim 18 wherein the computer readable instructions provide a means for controlling the computer apparatus to convert prediction residuals to interpolation residuals corresponding to gain vector elements by an iterative approach in which each iteration changes an index of a residual or of an intermediate quantity derived therefrom.

22. A computer software product according to claim 21 wherein the computer readable instructions provide a means for controlling the computer apparatus to implement the iterative approach by a divide and conquer approach which treats prediction residuals as interpolation residuals, and by proceeding with iteration until the index is changed appropriately to convert the prediction residual to an interpolation residual providing an element of the gain vector in un-normalised form.

23. A computer software product according to claim 22 wherein the prediction residuals are least squares prediction residuals and the computer readable instructions provide a means for controlling the computer apparatus to implement the iterative approach by treating the prediction residuals as interpolation residuals with zero values for one of two indices corresponding to absence of succeeding and preceding time series signal samples respectively, and by proceeding with iteration until the zero index in each ease is changed sufficiently to convert the forward or backward residual to an interpolation residual which is also an element of the gain vector in un-normalised form.

24. A computer software program according to claim 21 wherein the computer readable instructions provide a means for controlling the computer apparatus to implement the iterative approach by treating as an intermediate result an iteration in a sequence thereof leading to an element of the gain vector, and by proceeding with iteration until an index of the intermediate result is changed sufficiently to convert such result to an interpolation residual corresponding to an element of the gain vector.

25. A computer software product according to claim 24 for use in implementing a digital filter of order N where N is equal to $2^x$ and x is an integer, wherein the computer readable instruction provide a means for controlling the computer apparatus to implement iteration in a sequence to generate an un-normalised element of the gain vector beginning with use of one of two residuals immediately adjacent and on opposite sides of a halfway point, the residual of use being that having a relatively higher value of an index not to be altered in the iteration sequence, and the relevant halfway point being halfway between two quantities:
   q) one of which is an interpolation residual and the other a member of the relevant time series for which the gain vector is generated, or
   r) one of which is an interpolation residual and the other a starting point for an earlier iteration, or
   s) which are respectively starting and end points for an earlier iteration.

26. A computer software product according to claim 24 for use in implementing a digital filter of order N where N is equal to a sum of integers each of which is a power of two, wherein the computer readable instructions provide a means for controlling the computer apparatus to implement the iterative approach by treating the filter as a combination of filters each of order a respective power of two.

27. A computer software product according to claim 26 wherein the computer readable instructions provide a means for controlling the computer apparatus to implement iteration in a sequence to generate an un-normalised element of the gain vector beginning with use of one of two residuals immediately adjacent and on opposite sides of a halfway point, the residual of use being that having a relatively higher value of an index not to be altered in the iteration sequence, and the relevant halfway point being halfway between two quantities:
- t) one of which is an interpolation residual and the other a member of the relevant time series for which the gain vector is generated, or
- u) one of which is an interpolation residual and the other a starting point for an earlier iteration, or
- v) which are respectively staring and end points for an earlier iteration.

28. A computer software product according to claim 18 wherein the computer readable instructions provide a means for controlling the computer apparatus to convert prediction residuals to interpolation residuals corresponding to elements of a gain vector by a QR decomposition approach in which equations of the form:
- w) $\zeta(i)=\psi(i)+k(i)\xi(i)$ are solved for $\zeta(i)$ and $k(i)$ given $\psi(i)$ and $\xi(i)$ subject to a constraint that in so doing there is minimization of a sum of squares of $\psi(j)+k(i)\xi(j)$ obtained for different sample indexes j, where $\zeta(i)$ is an a posteriori interpolation residual, $\psi(i)$ and $\xi(i)$ are a posteriori modified prediction and interpolation residuals respectively, and $k(i)$ is a coefficient to be determined; and
- x) $\psi(i)=\zeta(i) -k(i)\xi(i)$ are solved for $\psi(i)$ and $\xi(i)$ $k(i)$ given $\zeta(i)$ and $\xi(i)$ subject to a constraint that in so doing the value of $k(i)$ that is obtained is substantially that which would be obtained in solving $\zeta(i)=\psi(i)+k(i)\xi(i)$ for $\zeta$ and $k(i)$.

29. A computer software product according to claim 28 wherein the QR decomposition employs square root free equivalents of sine and cosine rotation parameters.

* * * * *